United States Patent
Tanigawa et al.

(10) Patent No.: US 10,371,759 B2
(45) Date of Patent: Aug. 6, 2019

(54) MAGNETIC FIELD DETECTION SENSOR

(71) Applicant: Yazaki Corporation, Minato-ku, Tokyo (JP)

(72) Inventors: Junya Tanigawa, Susono (JP); Hiroki Sugiyama, Susono (JP); Makoto Ishii, Susono (JP); Takahiro Syouda, Susono (JP)

(73) Assignee: Yazaki Corporation, Minato-ku, Tokyo (JP)

( * ) Notice: Subject to any disclaimer, the term of this patent is extended or adjusted under 35 U.S.C. 154(b) by 0 days.

(21) Appl. No.: 15/824,445

(22) Filed: Nov. 28, 2017

(65) Prior Publication Data

US 2018/0149714 A1 May 31, 2018

(30) Foreign Application Priority Data

Nov. 30, 2016 (JP) ................................. 2016-232819

(51) Int. Cl.
*G01R 33/028* (2006.01)
*G01R 33/06* (2006.01)

(52) U.S. Cl.
CPC ......... *G01R 33/028* (2013.01); *G01R 33/063* (2013.01)

(58) Field of Classification Search
CPC .............................. G01R 33/028; G01R 33/063
USPC .................................... 324/260, 200, 207.21
See application file for complete search history.

(56) References Cited

U.S. PATENT DOCUMENTS

| 3,201,746 | A | * | 8/1965 | Askew | G01R 1/06788 |
| | | | | | 439/482 |
| 5,764,055 | A | | 6/1998 | Kawase | |
| 6,028,427 | A | | 2/2000 | Kawase | |
| 6,032,994 | A | * | 3/2000 | Chen | G01R 1/06705 |
| | | | | | 294/213 |
| 9,791,522 | B2 | | 10/2017 | Tanigawa et al. | |
| 2007/0236236 | A1 | * | 10/2007 | Shell | G01R 1/0466 |
| | | | | | 324/750.3 |
| 2016/0178714 | A1 | * | 6/2016 | Fautz | G01R 33/483 |
| | | | | | 324/309 |
| 2016/0245879 | A1 | | 8/2016 | Tanigawa et al. | |

(Continued)

FOREIGN PATENT DOCUMENTS

| JP | H09-127218 A | 5/1997 |
| JP | 2000-180521 A | 6/2000 |
| JP | 2015-092144 A | 5/2015 |

*Primary Examiner* — Giovanni Astacio-Oquendo
(74) *Attorney, Agent, or Firm* — Banner & Witcoff, Ltd.

(57) ABSTRACT

A magnetic field detection sensor includes a first magneto-impedance element and a second magneto-impedance element each having a magnetic material, a bias coil applying a bias magnetic field to the magnetic body of the first magneto-impedance element, a high-frequency oscillation circuit supplying high-frequency current to the magnetic bodies of the first magneto-impedance element and the second magneto-impedance element, an AC bias circuit supplying AC bias current to the bias coil, a first detection circuit generating a first detection signal based on an impedance change of the first magneto-impedance element in a state of being applied with the bias magnetic field and an external magnetic field, and a second detection circuit which generates a second detection signal based on an impedance change of the second magneto-impedance element in a state of being applied with the external magnetic field and without the bias magnetic field.

10 Claims, 13 Drawing Sheets

(56) References Cited

U.S. PATENT DOCUMENTS

2017/0319097 A1* 11/2017 Amthor .................. A61B 5/055
2018/0024214 A1* 1/2018 Bhat .................. G01R 33/4828
                                                                                               324/309

* cited by examiner

MAGNETIC FIELD DETECTION SENSOR

CROSS REFERENCE TO RELATED APPLICATIONS

This application claims priority from Japanese Patent Application No. 2016-232819 filed on Nov. 30, 2016, the entire contents of which are incorporated herein by reference.

BACKGROUND OF THE INVENTION

Field of the Invention

The present invention relates to a magnetic field detection sensor utilizing magneto-impedance effect.

Description of Related Art

A magnetic sensor of a related art which includes a magneto-impedance (MI) element utilizing magneto-impedance effect is disclosed in, for example, Patent Documents 1 to 3. For example, in a high-permeability alloy magnetic body such as an amorphous alloy wire, an impedance changes sensitively according to an external magnetic field due to influence of skin effect. This is the magneto-impedance effect.

In the configuration disclosed in Patent Document 1, an MI element is incorporated in a Colpitts oscillation circuit. An AC bias magnetic field is applied to the MI element by flowing AC bias current to a coil wound around the MI element. The oscillation circuit outputs an amplitude-modulated waveform according to an impedance change of the MI element depending on an external magnetic field and a bias magnetic field. A difference in height of the amplitude-modulated waveform corresponds to an intensity of the external magnetic field. The amplitude-modulated waveform is detected, and a DC component is removed from the detected waveform. Then, a comparator compares the resultant detected waveform with a voltage to acquire an output signal with a digital waveform having been pulse-width modulated. That is, an intensity of the external magnetic field is obtained based on a change amount in the amplitude of the output of the oscillation circuit.

In the configuration disclosed in Patent Document 2, a high-frequency sine wave current outputted from an oscillation circuit is applied to both ends of a magnetic core of a thin-film magneto-impedance element via a buffer circuit. A detector circuit detects a change amount of an external magnetic field based on a change amount of the high-frequency current that changes according to the external magnetic field applied to the magneto-impedance element. There is provided with a hysteresis cancel circuit for cancelling hysteresis of the magneto-impedance element. A bias coil is applied with current in order to shift an operation point of the magneto-impedance element. Further, a negative-feedback coil is applied with current according to a detected magnetic field.

A magnetic field detection sensor disclosed in Patent Document 3 employs a magneto-impedance element with specific configuration. That is, the longitudinal direction of the magneto-impedance element matches the magnetic field detecting direction, and the magneto-impedance element is configured to have a magnetic anisotropy such that an axis of easy magnetization of a magnetic film matches the longitudinal direction. By matching the direction of the magnetic field detecting direction and the axis of easy magnetization of the magnetic film, pyramid-shaped magneto-impedance characteristics can be achieved. Thus, application of a DC or AC bias up to a level at which the inclination of the impedance change becomes steep, as in a case of M-shaped characteristics, is rendered unnecessary. Moreover, because the pyramid-shaped characteristics exhibits a smaller hysteresis than the M-shaped characteristics, detection precision can be improved. Further, because the pyramid-shaped characteristics have a predetermined inclination across the entire range, a wider detection range can be ensured. Therefore, the current consumption can be reduced, detection precision can be improved, and a wider detection range can be achieved.

[Patent Document 1] JP-A-9-127218
[Patent Document 2] JP-A-2000-180521
[Patent Document 3] JP-A-2015-92144

However, the magnetic field detection sensor of the related art utilizing the magneto-impedance effect as disclosed in Patent Documents 1 and 2 has the following problems. (1) The detection range of magnetic field is narrow. (2) Since the magneto-impedance characteristics of the magneto-impedance element is the M-shaped characteristics, in a case of using the AC bias, high-sensitive measurement cannot be achieved unless the AC bias is applied up to a level at which the inclination of the impedance change becomes steep. As a result, the current consumption increases. (3) The magneto-impedance element with the M-shaped characteristics exhibits a larger hysteresis than that with the pyramid-shaped characteristics. Thus, detection precision deteriorates.

On the other hand, in a case of employing the magneto-impedance element with the pyramid-shaped magneto-impedance characteristics as disclosed in Patent Document 3, the aforesaid problems (2) and (3) can be improved. However, in a case of detecting the magnetic field using a circuit configured as shown in FIG. 1 of Patent Document 3, when a magnitude of an external magnetic field becomes large, a required pulse does not appear in the output of a differentiating circuit shown in FIG. 6(d) of Patent Document 3. Thus, a phase of the pulse cannot be sensed and hence the magnetic field cannot be detected. As a result, the aforesaid problem (1) cannot be solved.

SUMMARY

One or more embodiments provide a magnetic field detection sensor which can reduce current consumption, improve detection precision, and enlarge a magnetic field detection range.

In an aspect (1), one or more embodiments provide a magnetic field detection sensor including a first magneto-impedance element and a second magneto-impedance element each having a magnetic material, a bias coil applying a bias magnetic field to a magnetic body of the first magneto-impedance element, a high-frequency oscillation circuit supplying high-frequency current to the magnetic body of the first magneto-impedance element and a magnetic body of the second magneto-impedance element, an AC bias circuit supplying AC bias current to the bias coil, a first detection circuit generating a first detection signal based on an impedance change of the first magneto-impedance element in a state of being applied with the bias magnetic field and an external magnetic field, a second detection circuit generating a second detection signal based on an impedance change of the second magneto-impedance element in a state of being applied with the external magnetic field and without the bias magnetic field, and a magnetic field calculation unit calculating a magnitude and a direction of the external magnetic field based on the first detection signal and the second detection signal.

In an aspect (2), the first detection circuit generates an electric signal which changes according to a change amount of the impedance from a reference point that is an extremal value position of the impedance characteristic of the first magneto-impedance element in a state of being not applied with the external magnetic field, and the first detection circuit includes at least one of an amplitude detection circuit detecting amplitudes at each of peaks in which positive and negative of a changing ratio of voltage of the electric signal switches, and a phase detection circuit detecting a timing at which the voltage of the electric signal passes the reference point.

In an aspect (3), the magnetic field calculation unit performs weighting, using a weight which changes according to a situation, on at least one of the first detection signal and the second detection signal so as to calculate the magnitude of the external magnetic field.

In an aspect (4), the magnetic field calculation unit calculates the magnitude and the direction of the external magnetic field using a combination of the first detection signal and the second detection signal, which have different detection characteristics, and the magnetic field calculation unit performs polarity correction for each region and offset correction on the detection characteristic of at least one of the first detection signal and the second detection signal so that the plurality of detection characteristics become close to each other.

In an aspect (5), the magnetic field calculation unit performs gain adjustment on the detection characteristic of at least one of the first detection signal and the second detection signal so as to bring a non-linear region corresponding to a small magnetic field close to a linear region.

According to the aspect (1), the magnetic field calculation unit can calculate the magnitude and direction of the external magnetic field utilizing both of impedance change characteristics (first detection characteristics) of the first magneto-impedance element in the state of being applied with the bias magnetic field and impedance change characteristics (second detection characteristics) of the second magneto-impedance element in the state of being not applied with the bias magnetic field. The first and second detection characteristics of different kinds each may fall in an undetectable state or may degrade in detection accuracy or sensitivity depending on a region different in a magnitude or the like of the magnetic field. However, for example, by properly utilizing the first and second detection characteristics according to a magnitude of the magnetic field, high detection accuracy can be ensured over a wide range of the magnetic field.

According to the aspect (2), the first detection circuit generates the electric signal corresponding to the impedance change amount with respect to the reference point of the first magneto-impedance element. Therefore, it is not required to flow a large DC bias current in order to shift an operation point from the reference point. Further, a high-accuracy detection result can be obtained, for example, in a region of a relatively small magnetic-field by utilizing at least one of the amplitude detection circuit and the phase detection circuit.

According to the aspect (3), in a case of calculating a magnitude of the magnetic field utilizing both the first and second detection signals, the calculation result can be optimized by performing the weighting described above. For example, when the weights are increased for respective magnetic-field regions favorable for a detection process using the first detection signal and a detection process using the second detection signal, an error of the calculation result can be reduced over a wide magnetic-field range.

According to the aspect (4), even if the detection characteristics of the first detection signal and the detection characteristics of the second detection signal largely differ in a shape, these detection characteristics can be corrected to be close to each other in the shape. Thus, in a case of switching the weights of the plural detection characteristics at a certain region, numerical values of the calculation result can be avoided being discontinuous, and hence the switching process can be performed easily.

According to the aspect (5), even if there arises a non-linear or discontinuous portion in the region corresponding to a small magnetic field in the detection characteristics, the detection characteristics can be corrected to be linear as a whole by performing suitable gain adjustment on each region. Therefore, the detection accuracy can be improved over the wide range.

According to one or more embodiments, a magnetic field detection sensor enables suppression of current consumption, improvement of the detection accuracy and expansion of the magnetic field detection range. That is, first and second detection characteristics of different kinds each may fall in a undetectable state or may degrade in detection accuracy or sensitivity depending on a region different in a magnitude or the like of the magnetic field. However, for example, by properly utilizing the first and second detection characteristics according to a magnitude of the magnetic field, high detection accuracy can be ensured over the wide magnetic-field range. Further, by generating an electric signal which changes according to a change amount of an impedance from a reference point, a operation point is not required to be shifted from the reference point and a large DC bias current is not required to be flown.

The invention is explained above briefly. Further, a mode for carrying out the invention to be described below (hereinafter referred to as an "embodiment") will be described with reference to the appended drawings to further clarify the details of the invention.

DETAILED DESCRIPTION

Exemplary embodiments are described with reference to drawings.

<Configuration Example of Magnetic Field Detection Sensor 200>

Figure 1:
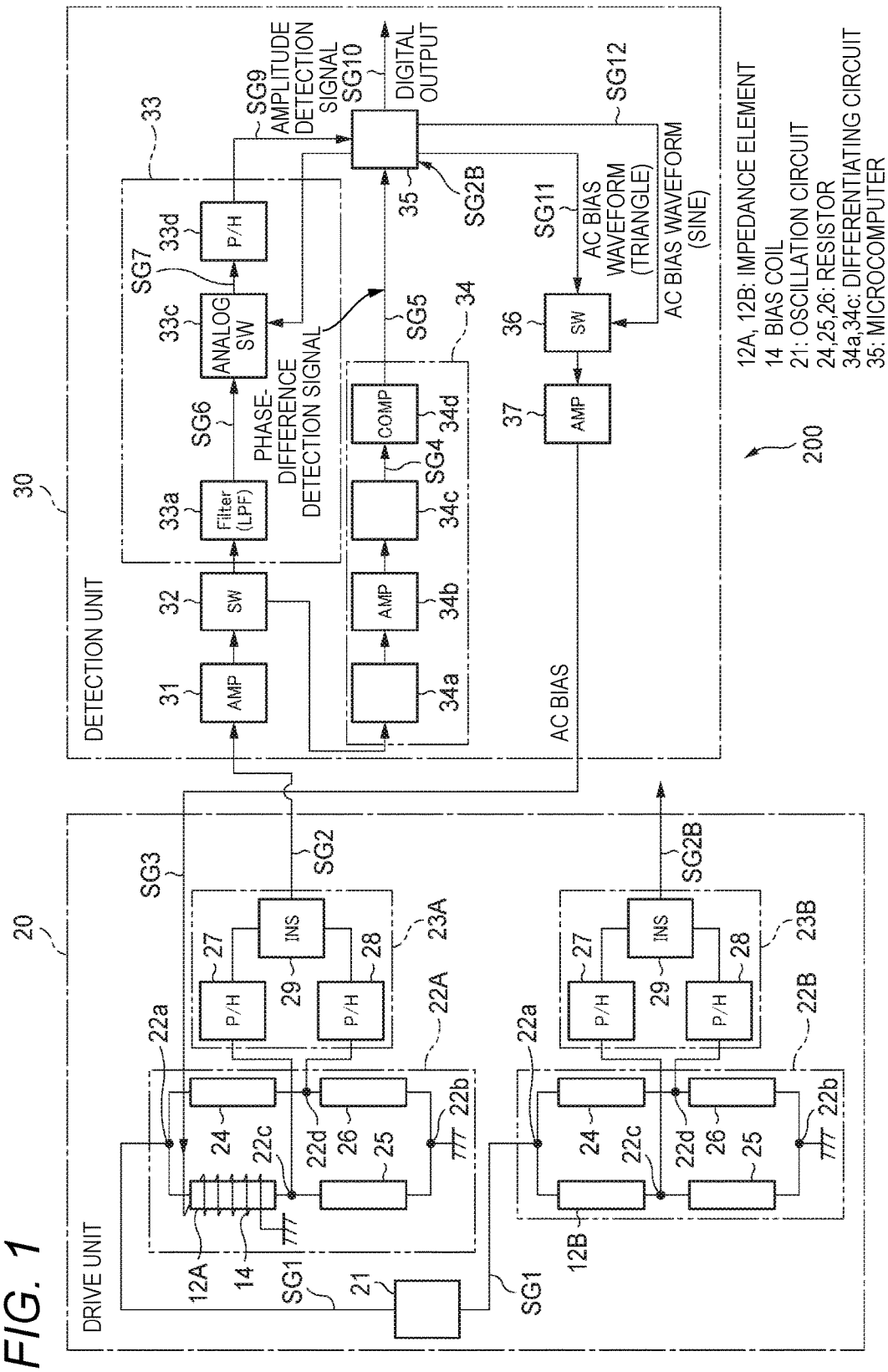
FIG. 1 is a block diagram illustrating a configuration example of a magnetic field detection sensor according to an embodiment of the invention.

A configuration example of a magnetic field detection sensor 200 according to the embodiment of the invention is illustrated in FIG. 1.

The magnetic field detection sensor 200 illustrated in FIG. 1 is configured of a drive unit 20 and a detection unit 30. Although details will be explained later, each of two magneto-impedance elements 12A and 12B included in the drive unit 20 contains a magnetic body causing a magneto-impedance effect. Thus, the magnetic field detection sensor 200 detects an external magnetic field utilizing the magneto-impedance elements 12A and 12B.

The drive unit 20 illustrated in FIG. 1 includes an oscillation circuit 21, bridge circuits 22A and 22B, and signal processing units 23A and 23B. One bridge circuit 22A is configured of the magneto-impedance element 12A and three resistors 24, 25 and 26. In the magneto-impedance element 12A, one end and the other end in the longitudinal direction of the magnetic body are connected to the bridge circuit 22A. The other bridge circuit 22B differs from the bridge circuit 22A only in a point that the magneto-impedance element 12B is used in place of the magneto-impedance element 12A.

A bias coil 14 is arranged around a circumference of the magnetic body of the magneto-impedance element 12A. The bias coil 14 is provided so as to apply an AC bias magnetic field to the magnetic body of the magneto-impedance element 12A. In this embodiment, the bias coil 14 is also utilized for generating a negative-feedback magnetic field. An AC bias signal SG3 is applied to one end of the bias coil 14. The other end of the bias coil 14 is grounded. A waveform of the AC bias signal SG3 is basically a triangle wave but may be a sine wave or a rectangular wave.

The bias coil 14 is provided only in the magneto-impedance element 12A and not in the other magneto-impedance element 12B. That is, one magneto-impedance element 12A operates in a state of being applied with the AC bias magnetic field and the other magneto-impedance element 12B operates in a state of not being applied with the AC bias magnetic field.

The magneto-impedance elements 12A and 12B are incorporated in the bridge circuits 22A and 22B as resistors, respectively. The magneto-impedance elements 12A and 12B employed in this embodiment each exhibits characteristics in which an impedance (DC resistance) becomes the maximum in a reference state not being applied with an external magnetic field. Resistance values of the resistors 24, 25 and 26 are selected such that the bridge circuits 22A and 22B become a balanced state in the maximum impedance status of the magneto-impedance elements 12A and 12B, respectively.

Terminals 22a and 22b on both input sides of each of the bridge circuits 22A and 22B are connected to an output of the oscillation circuit 21 and the ground, respectively. The oscillation circuit 21 supplies high-frequency voltage having a frequency of, for example, about several tens MHz to each of the bridge circuits 22A and 22B as a signal SG1. A waveform of the signal SG1 is a rectangular wave.

Terminals 22c and 22d on an output side of the bridge circuit 22A are connected to input terminals of the signal processing unit 23A. Terminals 22c and 22d on an output side of the bridge circuit 22B are connected to input terminals of the signal processing unit 23B.

Two signal processing units 23A and 23B have the same internal configuration. Each of the signal processing units includes two peak-hold circuits (P/H) 27 and 28 and an instrument amplifier (INS) 29.

Two peak-hold circuits 27 detect and hold peak voltages appearing at the terminals 22c of the bridge circuits 22A and 22B, respectively. Two peak-hold circuits 28 detect and hold peak voltages appearing at the terminals 22d of the bridge circuits 22A and 22B, respectively. The instrumentation amplifier 29 amplifies a voltage difference between the peak voltage held by the peak-hold circuit 27 and the peak voltage held by the peak-hold circuit 28 and outputs as a signal SG2 or SG2B.

The detection unit 30 includes an amplifier (AMP) 31, a switch circuit (SW) 32, an amplitude detection circuit 33, a phase detection circuit 34, a microcomputer 35, a switch circuit 36, and an amplifier 37.

The amplitude detection circuit 33 includes a low-pass fitter (LPF) 33a, an analog switch 33c, and a peak-hold circuit 33d. The phase detection circuit 34 includes a differentiating circuit 34a, an amplifier 34b, a differentiating circuit 34c, and a comparator (COMP) 34d.

The microcomputer 35 executes a program, which is incorporated therein in advance, to perform various controls for achieving a function of the magnetic field detection sensor 200. For example, the microcomputer grasps a magnitude and a direction of an external magnetic field detected based on an amplitude detection signal SG9 outputted from the amplitude detection circuit 33, a phase-difference detection signal SG5 outputted from the phase detection circuit 34, and the output signal SG2B outputted from the signal processing unit 23B, and outputs detected information of the external magnetic field as a digital output signal SG10. The microcomputer 35 outputs an AC-bias waveform output signal SG11 of a triangle wave and an AC-bias waveform output signal SG12 of a since wave.

The AC-bias waveform output signals SG11 and SG12 are applied to the drive unit 20 via the switch circuit 36 and the amplifier 37 and supplied to the bias coil 14 as the AC bias signal SG3.

<Configuration Example of Magneto-Impedance Element 12>

Figure 2A:
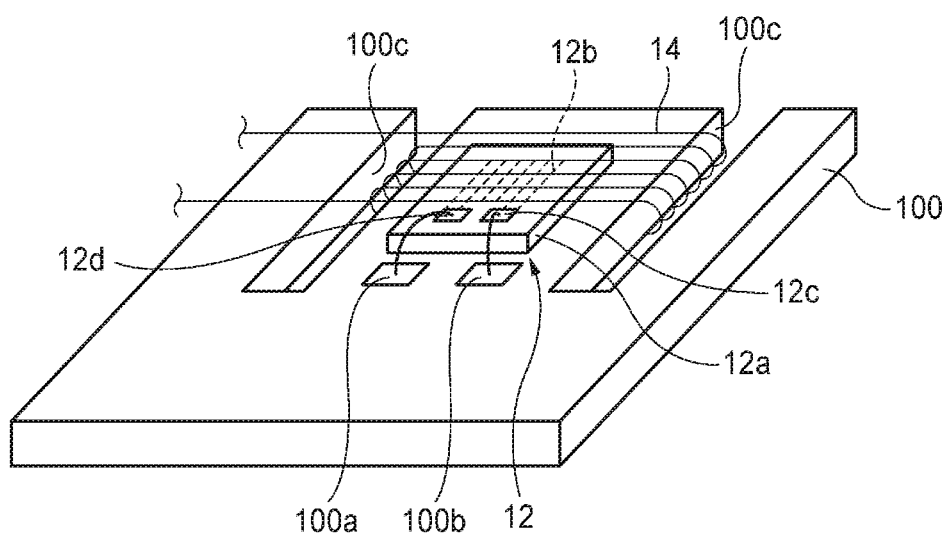
FIGS. 2A and 2B are perspective views illustrating configuration examples of two kinds of magneto-impedance elements.
Figure 2B:
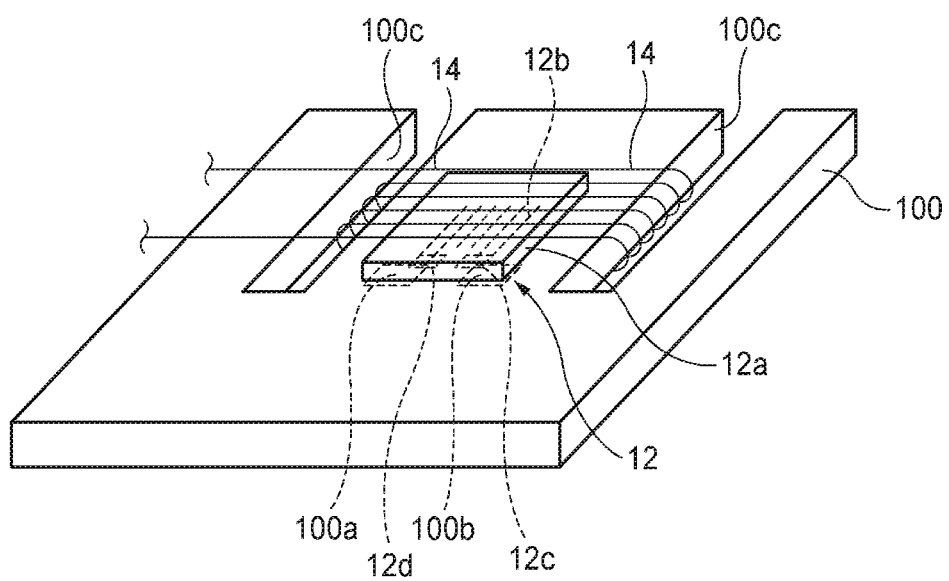

Configuration examples of two kinds of magneto-impedance elements 12 are illustrated in FIGS. 2A and 2B, respectively. As illustrated in FIG. 2A, the magneto-impedance element 12 includes a non-magnetic substrate 12a, a magnetic thin-film (magnetic film) 12b, and electrodes 12c and 12d.

The non-magnetic substrate 12a is a substrate made of a non-magnetic body, and is placed on a printed board 100. The non-magnetic substrate 12a is made of calcium titanate, oxide glass, titania, or alumina, for example, and has a substantially cuboid shape, in the embodiment.

The magnetic thin-film 12b is a high-permeability metal magnetic film, arranged in a surface of the non-magnetic substrate 12a opposite to a surface on which the printed board 100 is disposed, and has a meandering shape (serpentine shape) in a plan view, as illustrated in FIG. 2A. More specifically, the magnetic thin-film 12b has a rectangular-wave shape, rising and falling thereof extending in the longitudinal direction of the non-magnetic substrate 12a having the substantially cuboid shape.

The magnetic thin-film 12b is configured to have a magnetic anisotropy such that an axis-of-easy-magnetization direction is aligned with the longitudinal direction of the magnetic thin-film 12b on the film surface, and the axis-of-easy-magnetization direction of the magnetic thin-film 12b is aligned with the longitudinal direction of the non-magnetic substrate 12a as a whole.

The electrodes 12c and 12d are provided on the surface of the non-magnetic substrate 12a at both ends of the magnetic thin-film 12b, respectively. The electrodes 12c and 12d are connected to respective electrodes 100a and 100b provided on the printed board 100, via bonding wires. The electrodes 100a and 100b provided on the printed board 100 are connected to the terminals 22a and 22c of the bridge circuit 22 illustrated in FIG. 1, respectively.

The printed board 100 also has a notch 100c on each side of the magneto-impedance element 12 in the width direction, in a manner spaced with the magneto-impedance element 12, as illustrated in FIG. 2A. The notches 100c extend from one end of the printed board 100 toward proximity of the center of the printed board 100.

The bias coil 14 is wound around the circumference of the magneto-impedance element 12 via the notches 100c of the printed board 100. The direction of the coil axis of the bias coil 14 is therefore matched with the longitudinal direction of the non-magnetic substrate 12a, and, therefore, the magnetic field detecting direction matches the longitudinal direction of the magneto-impedance element 12. Because the axis-of-easy-magnetization direction is matched with the longitudinal direction of the non-magnetic substrate 12a, as described above, the magnetic thin-film 12b can be said to be provided with a magnetic anisotropy such that an axis of easy magnetization of this film matches the magnetic field detecting direction.

As illustrated in FIG. 2B, the magnetic thin-film 12b may be provided on a rear side of the non-magnetic substrate 12a, that is, on a surface on which the printed board 100 is disposed. In such a configuration, the electrodes 12c and 12d are provided at both ends of the magnetic thin-film 12b on the rear surface of the non-magnetic substrate 12a, respectively. The electrodes 100a and 100b on the printed board 100 are also provided on the rear side of the non-magnetic substrate 12a. Either configuration of FIG. 2A and FIG. 2B may be employed as the configuration of the magneto-impedance element 12 of the magnetic field detection sensor 200 illustrated in FIG. 1.

One magneto-impedance element 12A employed in the magnetic field detection sensor 200 illustrated in FIG. 1 includes the bias coil 14 as with the magneto-impedance elements 12 illustrated in FIGS. 2A and 2B. However, the other magneto-impedance element 12B is not provided with the bias coil 14 because the bias coil is not required.

<Magneto-Detection Characteristics of Magneto-Impedance Element 12>

Figure 3:
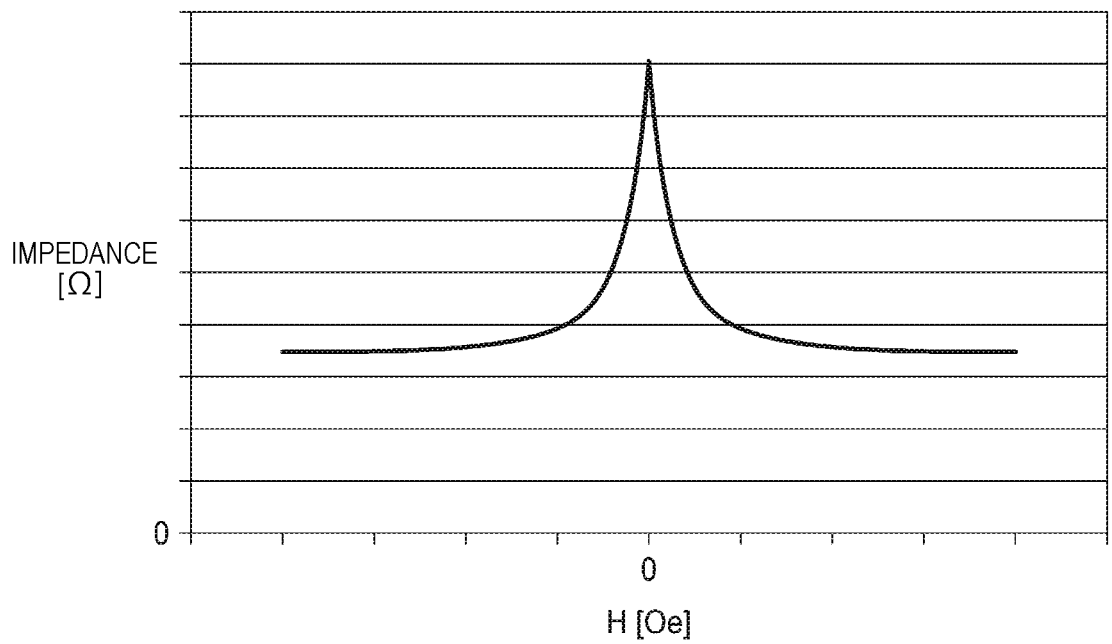
FIG. 3 is a graph illustrating a concrete example of magneto-detection characteristics of the magneto-impedance element.

FIG. 3 illustrates a concrete example of magneto-detection characteristics of the magneto-impedance element 12. In FIG. 3, an abscissa represents a magnitude and a direction [Oe] of the external magnetic field H and an ordinate represents an impedance (DC resistance) [Ω] between both ends in the longitudinal direction of the magnetic thin-film 12b.

As illustrated in FIG. 3, the impedance of the magneto-impedance element 12 becomes the maximum when the magnitude of the external magnetic field is zero, and reduces in proportional to the magnitude of the external magnetic field when the external magnetic field of the positive direction or the negative direction is applied, and thus exhibits pyramid-shaped characteristics. In this manner, the characteristics of the magneto-impedance elements 12, 12A and 12B largely differ from the characteristics of the general magneto-impedance element with the M-shaped characteristics as disclosed in Patent Documents 1 and 2.

By employing the magneto-impedance elements 12, 12A and 12B with the pyramid-shaped characteristics, an inclination of the impedance change with respect to the change of the external magnetic field becomes large sufficiently even if the impedance is near a reference point which is an external value (peak value in this case), as illustrated in FIG. 3. Thus, the external magnetic field can be detected with high sensitivity without shifting an operation point to a position deviated from the reference point or flowing a large bias current.

<Arrangement Mode, Magneto-Sensitive Axis, Direction of External Magnetic Field>

Figure 4:
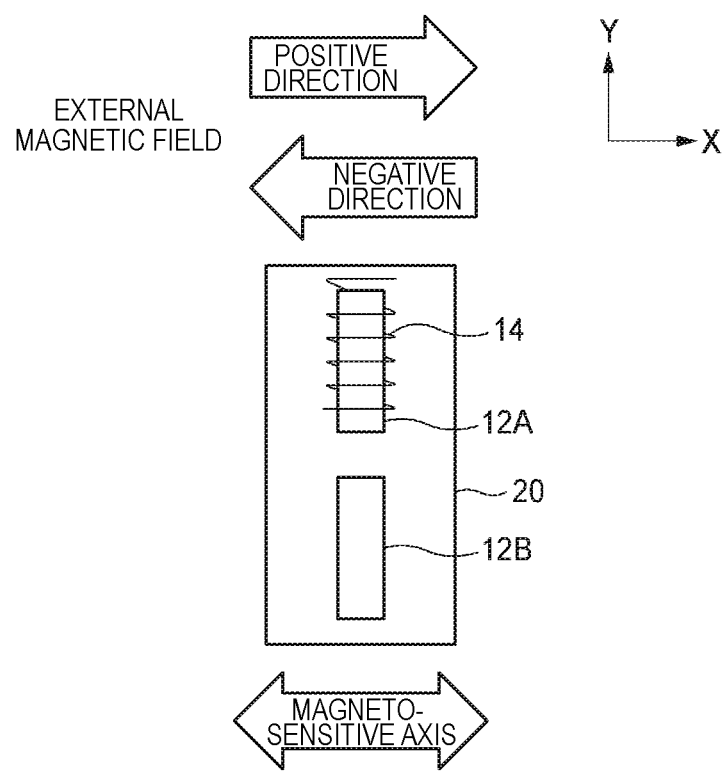
FIG. 4 is a front view illustrates an example of an arrangement mode and a magneto-sensitive axis of a plurality of the magneto-impedance elements, and a direction of an external magnetic field.

FIG. 4 illustrates an example of an arrangement mode and a magneto-sensitive axis of the plurality of magneto-impedance elements 12, 12A and 12B, and a direction of an external magnetic field.

Two magneto-impedance elements 12A and 12B provided in the magnetic field detection sensor 200 illustrated in FIG. 1 are disposed closely to each other along the same axis (Y axis), for example, as illustrated in FIG. 4. Further, the magneto-impedance elements 12A and 12B are disposed side by side such that the longitudinal directions of the magnetic thin-films 12b thereof match to each other, as illustrated in FIG. 4.

Consequently, in the example illustrated in FIG. 4, the magneto-sensitive axis of each of two magneto-impedance elements 12A and 12B is parallel to the X axis. The impedances of the magneto-impedance elements 12A and 12B therefore change in a manner as illustrated in FIG. 3 according to the external magnetic field in the positive or negative direction of the X axis.

<Basic Operation Principle in a Case of Using One Magneto-Impedance Element 12A>

Figure 5:
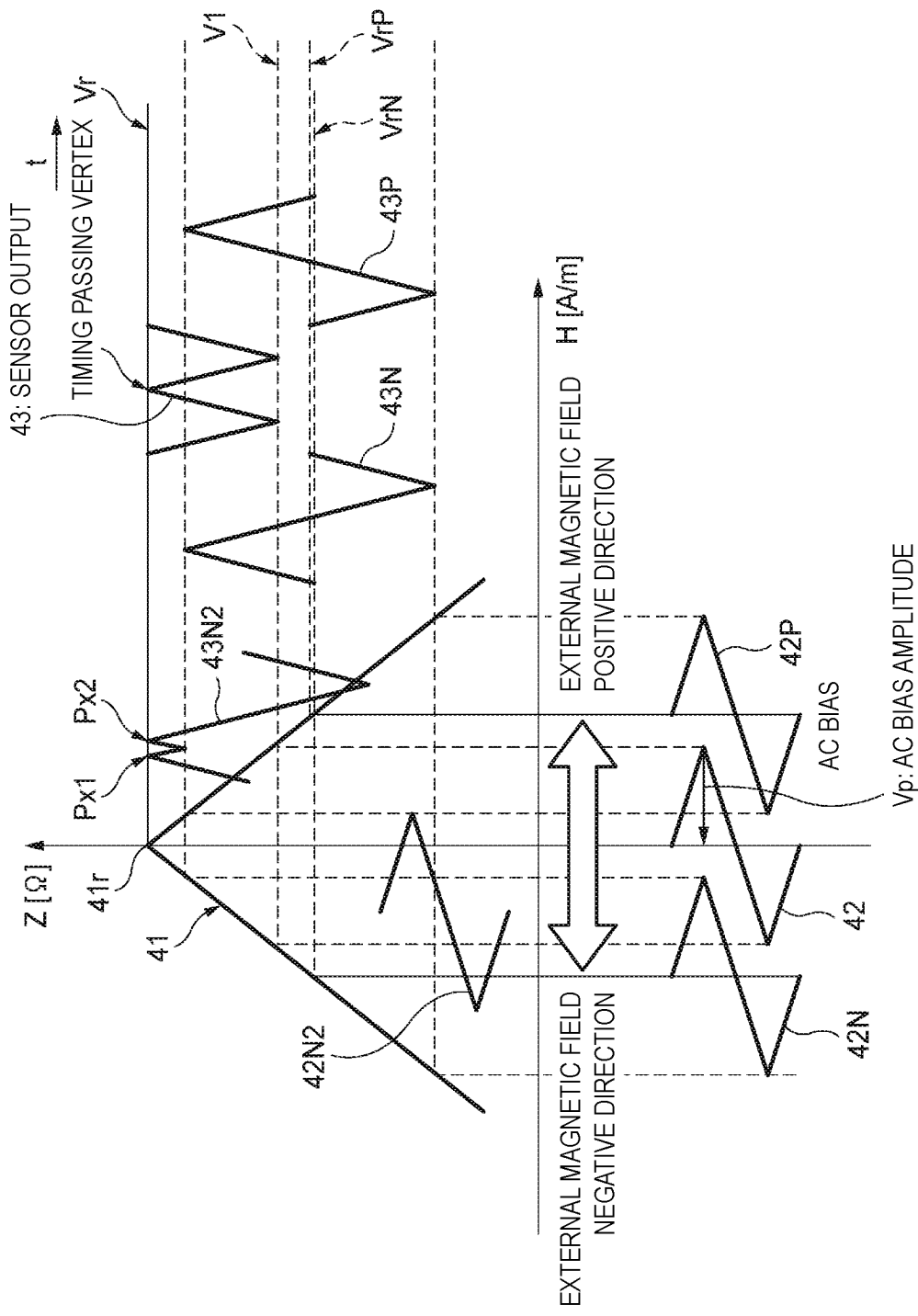
FIG. 5 is a graph illustrating an example of a correlation between an input magnetic field and an output signal in the magneto-impedance element applied with AC bias.

FIG. 5 illustrates an example of a correlation between an input magnetic field and an output signal in the magneto-impedance element 12A. In a graph of impedance characteristics 41 illustrate 3d in FIG. 5, an abscissa represents a magnitude and a direction [A/m] of the input magnetic field H applied to the magneto-impedance element 12A and an ordinate represents an impedance Z (AC resistance value) [Ω] between both ends in the longitudinal direction of the magnetic thin-film 12b of the magneto-impedance element 12A.

In a case of using the other magneto-impedance element 12B illustrated in FIG. 1, since the AC bias is not applied, the microcomputer 35 can detect the magnitude of the external magnetic field utilizing the signal SG2B which is obtained by directly converting a change of the impedance illustrated in FIG. 3 into a voltage.

An AC bias magnetic field 42 generated by the current flowing through the bias coil 14 is applied to the magnetic thin-film 12b such that the magneto-impedance element 12A operates centering on a reference point 41r of the impedance characteristics 41 as illustrated in FIG. 5. The example illustrated in FIG. 5 supposes a case in which the AC bias magnetic field 42 of a triangle wave having an amplitude Vp is applied. The AC bias magnetic field 42 thus changes with the amplitude Vp alternately in the positive direction and the negative direction centering on the reference point 41r.

In addition to the AC bias magnetic field 42, the external magnetic field as a detection target is applied to the magnetic thin-film 12b. Sums 42P, 42N, 42N2, etc. of the external magnetic field and the AC bias magnetic field are therefore applied to the magnetic thin-film. 12b, as illustrated in FIG. 5. That is, in a case where the polarity of the external magnetic field is positive, the magnetic field waveform shifting the waveform of AC bias magnetic field 42 in the positive direction by the magnitude of the external magnetic field is applied to the magnetic thin-film 12b as the sum 42P of the external magnetic field and the AC bias magnetic field. In a case where the polarity of the external magnetic field is negative, the magnetic field waveform shifting the waveform of AC bias magnetic field 42 in the negative direction by the magnitude of the external magnetic field is applied to the magnetic thin-film 12b, as the sum 42N or 42N2 of the external magnetic field and the AC bias magnetic field.

The impedance Z changes according to the impedance characteristics 41 and the magnetic field applied to the magnetic thin-film 12b, that is, the AC bias magnetic field 42 and the sums 42P, 42N, and 42N2 of the external magnetic field and the AC bias magnetic field. The change of the impedance Z can be extracted as sensor output signals 43, 43P, 43N, and 43N2 using, for example, the bridge circuit 22A illustrated in FIG. 1.

In FIG. 5, the sensor output signals 43, 43P, 43N, and 43N2 correspond to the AC bias magnetic field 42 and the sums 42P, 42N, and 42N2 of the external magnetic field and the AC bias magnetic field, respectively. That is, states of the sensor output signals 43, 43P, 43N, and 43N2 are determined based on the external magnetic field and the change of the AC bias magnetic field 42. In the sensor output signals 43, 43P, 43N, and 43N2 illustrated in FIG. 5, a vertical direction represents a voltage and an amplitude of the signal and a transverse direction represents time t.

The sensor output signal 43 is outputted when the external magnetic field is zero. That is, sensor output signal 43 is acquired which changes according to the change of the AC bias magnetic field 42 between a voltage Vr corresponding to a resistance value of the reference point 41r and a voltage V1 shifted from the voltage Vr by a voltage corresponding to the amplitude Vp.

When the external magnetic field of the positive polarity is applied, the sensor output signal 43P is acquired which changes according to the change of the AC bias magnetic field 42 between voltages shifted up and down by the voltage corresponding to the amplitude Vp centering on a voltage VrP, that is shifted by the magnitude of the external magnetic field from the voltage Vr of the reference point 41r. When the external magnetic field of the negative polarity is applied, the sensor output signal 43N is acquired which changes according to the change of the AC bias magnetic field 42 between voltages shifted up and down by the voltage corresponding to the amplitude Vp centering on a voltage VrN, that is shifted by the magnitude of the external magnetic field from the voltage Vr of the reference point 41r.

Individual changes according to the change of the magnitude and direction of the external magnetic field appear among the sensor output signals 43, 43P, and 43N, as illustrated in FIG. 5. The magnitude and direction of the external magnetic field can therefore be specified based on the sensor output signals 43P and 43N.

When the magnitude of the external magnetic field is smaller than the amplitude Vp of the AC bias magnetic field 42, the sensor output signal 43N2 is acquired according to a change of the magnetic field 42N2. In this case, a vertex Px1 or Px2, at which the change direction of the voltage of the sensor output signal 43N2 switches, appears at a timing where the magnetic field 42N2 passes the reference point (magnetic field is zero) 41r. Timings at which the vertices Px1 and Px2 appear change according to the magnitude of the external magnetic field. The magnitude of the external magnetic field can therefore be calculated, for example, by measuring a phase difference between the vertices Px1 and Px2.

<Example of Change of Main Signals within Magnetic Field Detection Sensor 200>

Figure 6:
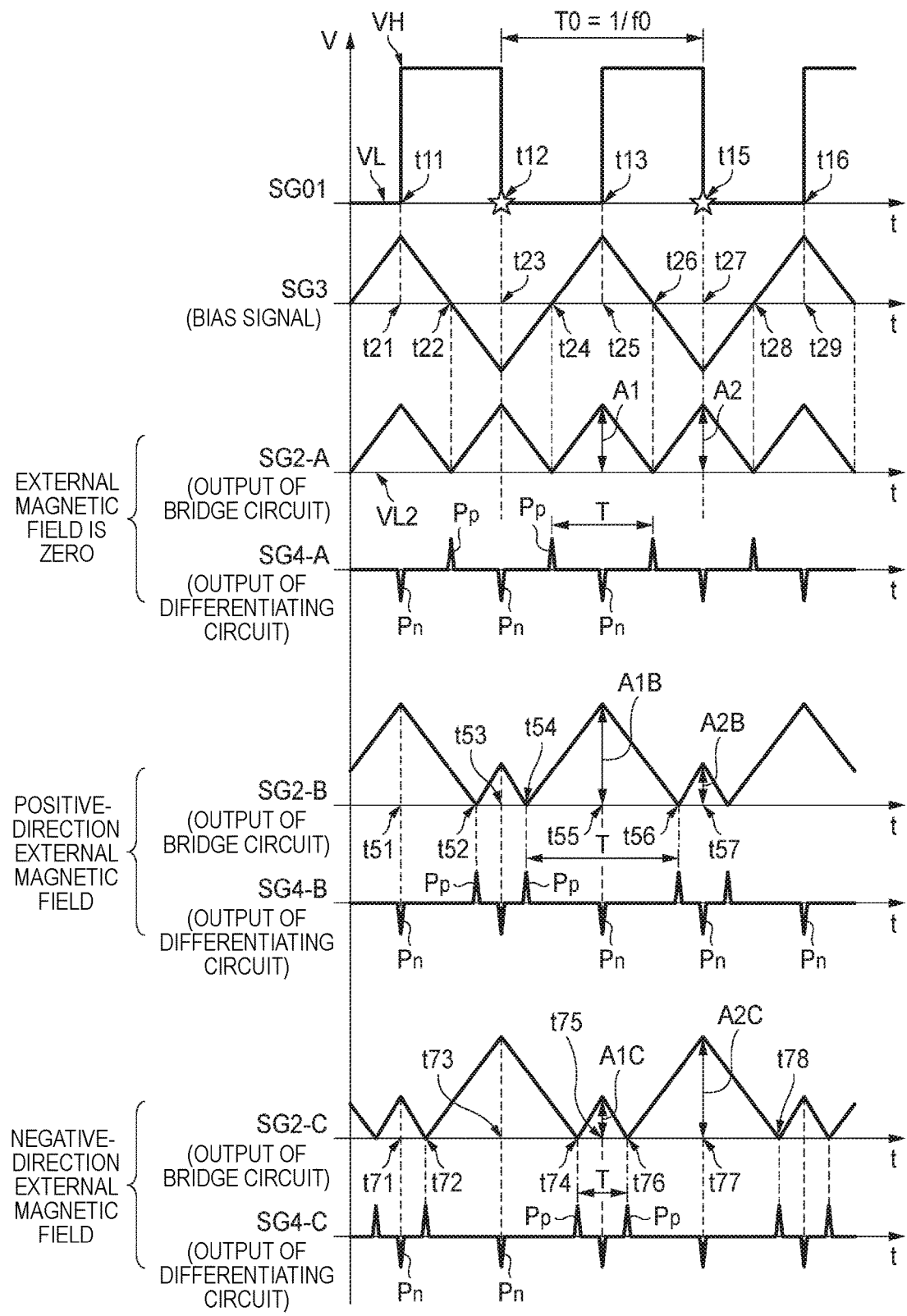
FIG. 6 is a timing chart illustrating an example of change of main signals within the magnetic field detection sensor.

FIG. 6 illustrates an example of change of the main signals within the magnetic field detection sensor 200. In each signal illustrated in FIG. 6, an abscissa represents common time t and an ordinate represents a voltage.

A waveform of the AC bias signal SG3 applied to the bias coil 14 is a triangle wave as illustrated in FIG. 6. The AC bias signal SG3 is generated based on a signal SG01 having a rectangular wave outputted from the microcomputer 35.

For example, when the signal SG01 raises from a low voltage VL to a high voltage VH at time t11, a voltage of the AC bias signal SG3 starts reducing with a constant inclination and continues this reducing state until the signal SG01 falls from the high voltage VH to the low voltage VL at time t12. The voltage of the AC bias signal SG3 starts increasing with a constant inclination at time t12 and continues this increasing state until the signal SG01 raises from the low voltage VL to the high voltage VH at time t13. The triangle wave is generated by repeating these operations.

Signals SG2-A, SG2-B and SG2-C illustrated in FIG. 6 each correspond to an output of the bridge circuit 22A, for example, a waveform of the signal SG2 outputted from the signal processing unit 23A in FIG. 1. Signals SG4-A, SG4-B and SG4-C each correspond to an output of the differentiating circuit, for example, a waveform of the signal SG4 outputted from the differentiating circuit 34c in FIG. 1. The signals SG2-A and SG4-A each represent a state where the external magnetic field is zero. The signals SG2-B and SG4-B each represent a case where the external magnetic field has the positive polarity. The signals SG2-C and SG4-C each represent a case where the external magnetic field has the negative polarity.

The waveform of the signal SG2-A illustrated in FIG. 6 changes in the similar manner as that of the sensor output signal 43 illustrated in FIG. 5. That is, the signal SG2-A becomes a low voltage VL2 corresponding to the reference point 41r at each of times t22, t24, etc. at which the voltage of the AC bias signal SG3 becomes zero. The signal SG2-A changes to a voltage higher than VL2 according to the voltage change of the bias signal SG3 during a period other than the aforesaid times. The waveform of the signal SG2-A therefore becomes a triangle wave but a period thereof is a half of that of the bias signal SG3.

<Case where External Magnetic Field is Zero>

In the signal SG2-A, amplitudes A1 and A2 are the same. The amplitude A1 represents an amplitude of a vertex where the voltage of the bias signal SG3 changes from rising to falling, at each of times t21, t25, t29, etc. The amplitude A2 represents an amplitude of a vertex where the voltage of the bias signal SG3 changes from falling to rising, at each of times t23, t27, etc.

In the waveform of the signal SG4-A illustrated in FIG. 6, a negative-polarity pulse Pn having a small time width appears at a vertex where the voltage of the signal SG2-A changes from rising to falling, at each of times t21, t23, t25, etc. Further, in the waveform of the signal SG4-A, a positive-polarity pulse Pp having a small time width appears at a vertex where the voltage of the signal SG2-A changes from falling to rising, at each of times t22, t24, t26, etc.

In the waveform of the signal SG4-A, for example, a time period T between adjacent two positive-polarity pulses Pp is a half of one period T0 of the signal SG01 and constant. This is also applied to the negative-polarity pulse Pn. Supposing that a frequency of the signal SG01 is f0, the period T0 is represented by a reciprocal of the frequency, that is, (1/f0).

<Case where External Magnetic Field of Positive Polarity is Applied>

In the signal SG2-B, amplitudes A1B and A2B are different. The amplitude A1B represents an amplitude of a vertex where the voltage of the bias signal SG3 changes from rising to falling, at time t55 during one period T0 of the signal SG01. The amplitude A2B represents an amplitude of a vertex where the voltage of the bias signal SG3 changes from falling to rising, at time t57.

The signal SG2-B is influenced by the external magnetic field of positive polarity applied to the magnetic thin-film 12b. Thus, the amplitude A1B is larger than the amplitude A1 in the case where the external magnetic field is zero, while the amplitude A2B is smaller than the amplitude A2 in the case where the external magnetic field is zero. In other words, since changes of the amplitudes A1B and A2B reflect the magnitude and direction of the external magnetic field, the magnitude and direction of the external magnetic field can be calculated utilizing at least one of the amplitudes A1B and A2B.

In the waveform of the signal SG4-B illustrated in FIG. 6, a negative-polarity pulse Pn having a small time width appears at a vertex where the voltage of the signal SG2-B changes from rising to falling, at each of times t51, t53, t55, etc. Further, in the waveform of the signal SG4-B, a positive-polarity pulse Pp having a small time width appears at a vertex where the voltage of the signal SG2-B changes from falling to rising, at each of times t52, t54, t56, etc.

A timing of the positive-polarity pulse Pp in the waveform of this signal SG4-B is deviated as compared with that of the signal SG4-A. In other words, the external magnetic field influences a phase of the pulse Pp, that is, a timing at which this signal passes the reference point 41r of the impedance characteristics of the magneto-impedance element 12A. For example, the time period T, between the pulse Pp at time t54 where the voltage of this signal SG4-B starts increasing and the pulse Pp at time t56 where the voltage of this signal SG4-B starts increasing next, is larger than the time period in the case of the signal SG4-A.

In other words, the time period T between the adjacent two positive-polarity pulses Pp reflects the phase difference of each pulse Pp caused by the influence of the external magnetic field. The magnitude and direction of the external magnetic field can therefore be calculated by detecting the time period T or the phase difference of each pulse Pp.

<Case where External Magnetic Field of Negative Polarity is Applied>

In the signal SG2-C, amplitudes A1C and A2C are different. The amplitude A1C represents an amplitude of a vertex where the voltage of the bias signal SG3 changes from rising to falling, at time t75 during one period T0 of the signal SG01. The amplitude A2C represents an amplitude of a vertex where the voltage of the bias signal SG3 changes from falling to rising, at time t77.

The signal SG2-C is affected by the external magnetic field of negative polarity applied to the magnetic thin-film 12b. Thus, the amplitude A1C is smaller than the amplitude A1 in the case where the external magnetic field is zero, while the amplitude A2C is larger than the amplitude A2 in the case where the external magnetic field is zero. In other words, since the change of each of the amplitudes A1C and A2C reflects the magnitude and direction of the external magnetic field, the magnitude and direction of the external magnetic field can be calculated utilizing at least one of the amplitudes A1C and A2C.

In the waveform of the signal SG4-C illustrated in FIG. 6, a negative-polarity pulse Pn having a small time width appears at a vertex where the voltage of the signal SG2-C changes from rising to falling, at each of times t71, t73, t75, etc. Further, in the waveform of the signal SG4-C, a positive-polarity pulse Pp having a small time width appears at a vertex where the voltage of the signal SG2-C changes from falling to rising, at each of times t72, t74, t76, etc.

A timing of the positive-polarity pulse Pp in the waveform of this signal SG4-C is deviated as compared with that of the signal SG4-A. In other words, the external magnetic field influences a phase of the pulse Pp, that is, a timing at which the sum of magnetic fields passes the reference point 41r of the impedance characteristics of the magneto-impedance element 12A. For example, the time period T, between the pulse Pp at time t74 where the voltage of the signal SG4-C starts increasing and the pulse Pp at time t76 where the voltage of the signal SG4-C starts increasing next, is smaller than the time period in the case of the signal SG4-A.

In other words, the time period T between the adjacent two positive-polarity pulses Pp reflects the phase difference of each pulse Pp caused by the influence of the external magnetic field. The magnitude and direction of the external magnetic field can therefore be calculated by detecting the time period T or the phase difference of each pulse Pp.

<Example of Change of Main Signals when External Magnetic Field is Large>

Figure 7:
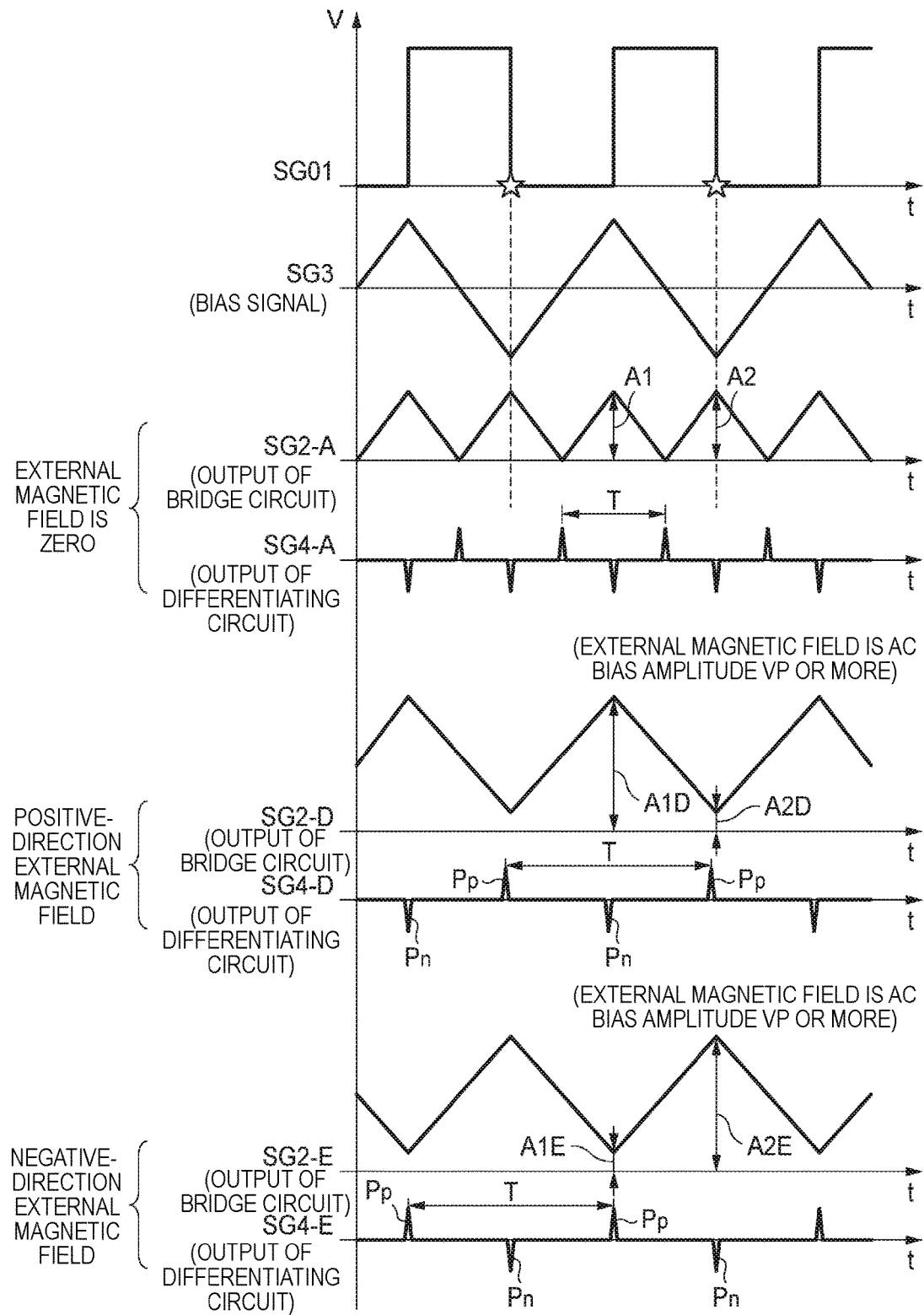
FIG. 7 is a timing chart illustrating an example of change of the main signals when the external magnetic field is large.

FIG. 7 illustrates an example of changes of the main signals when the external magnetic field is large. In each signal illustrated in FIG. 7, an abscissa represents common time t and an ordinate represents a voltage. The signals SG01, SG3, SG2-A, and SG4-A illustrated in FIG. 7 are the same as those illustrated in FIG. 6.

Signals SG2-A, SG2-D and SG2-E illustrated in FIG. 7 each correspond to an output of the bridge circuit 22A, for example, a waveform of the signal SG2 outputted from the signal processing unit 23A in FIG. 1. Signals SG4-A, SG4-D and SG4-E each correspond to an output of the differentiating circuit, for example, a waveform of the signal SG4 outputted from the differentiating circuit 34c in FIG. 1.

The signals SG2-A and SG4-A each represent a state where the external magnetic field is zero. The signals SG2-D and SG4-D each represent a case where the external magnetic field has the positive polarity and has a magnitude larger than the amplitude Vp of the AC bias. The signals SG2-E and SG4-E each represent a case where the external magnetic field has the negative polarity and has a magnitude larger than the amplitude Vp of the AC bias.

In the example illustrated in FIG. 7, since the external magnetic field is larger than the amplitude Vp, the signals SG2-D and SG2-E each have a waveform substantially same as that of the bias signal SG3. A phase of a positive-polarity pulse Pp appearing in the signal SG4-D therefore becomes constant, and a time period T between adjacent two pulses Pp also becomes constant. Similarly, a phase of a positive-polarity pulse Pp appearing in the signal SG4-E becomes constant, and a time period T between adjacent two pulses Pp also becomes constant.

Thus, in the status illustrated in FIG. 7, the external magnetic field cannot be detected from the phase or period of the pulse in the signal SG4-D or SG4-E. In other words, a change in the phase of the pulse Pp can be detected only when the magnitude of the external magnetic field is smaller than the amplitude Vp of the AC bias, like the signals SG4-B and SG4-C illustrated in FIG. 6.

However, even in the status illustrated in FIG. 7, since the amplitudes A1D and A2D of the signal SG2-D each reflect the magnitude of the external magnetic field, the magnitude and direction of the external magnetic field can be detected based on at least one of the amplitudes A1D and A2D. Similarly, since the amplitudes A1E and A2E of the signal SG2-E each reflect the magnitude of the external magnetic field, the magnitude and direction of the external magnetic field can be detected based on at least one of the amplitudes A1E and A2E.

<Operation of Detection Unit 30>

The signal SG2 outputted from the instrumentation amplifier 29 of the drive unit 20 is supplied to the amplifier 31 within the detection unit 30 illustrated in FIG. 1. When the external magnetic field is zero, the signal SG2 exhibits a triangle wave like the signal SG2-A illustrated in FIG. 6. When the external magnetic field has the positive polarity and the negative polarity, the signal SG2 exhibits waveforms like those of the signals SG2-B and SG2-C illustrated in FIG. 6, respectively. When the magnitude of the external magnetic field is equal to or larger than the amplitude Vp of the bias signal, the signal SG2 exhibits a waveform like that of the signal SG2-D or SG2-E illustrated in FIG. 7. The signal SG2 is amplified by the amplifier 31 and selectively supplied to one or both of the amplitude detection circuit 33 and the phase detection circuit 34 through the switching operation of the switch circuit 32.

<Operation of Amplitude Detection Circuit 33>

In the amplitude detection circuit 33, a signal having a waveform substantially equivalent to that of the signal SG2-A, SG2-B or SG2-C illustrated in FIG. 6 is supplied to an input of the low-pass fitter (LPF) 33a. The low-pass filter 33a performs an integral operation on the input signal to remove a high-frequency component. Thus, for example, when a triangle-wave signal is inputted, the low-pass filter 33a outputs a signal SG6 having a waveform close to a sine wave.

The analog switch 33c is controlled by an on-off signal SG8 generated from the bias signal SG3 of the microcomputer 35. The signal SG6 outputted from the low-pass filter 33a is inputted to the peak-hold circuit 33d via the analog switch 33c.

The peak-hold circuit 33d can detect and hold a peak voltage of a signal SG7 outputted from the analog switch 33c. Consequently, for example, voltages corresponding to the amplitudes A1B, A2B, A1C and A2C of the signals SG2-B and SG2-C illustrated in FIG. 6 each can be outputted as the amplitude detection signal SG9.

<Operation of Phase Detection Circuit 34>

In the phase detection circuit 34, a signal having a waveform substantially equivalent to that of the signal SG2-A, SG2-B or SG2-C illustrated in FIG. 6 is inputted to the differentiating circuit 34a from the switch circuit 32. In the phase detection circuit 34, the inputted signal is differentiated by the differentiating circuit 34a, amplified by the amplifier 34b, and differentiated again by the next differentiating circuit 34c, thereby being generated as the signal SG4.

Thus, like the signals SG4-B and SG4-C illustrated in FIG. 6, a negative-polarity pulse Pn is generated at a timing of each vertex where the voltage of the signal SG2-B or SG2-C switches from rising to falling. Similarly, a positive-polarity pulse Pp is generated at a timing (timing passing the reference point 41r) of each vertex where the voltage of the signal SG2-B or SG2-C switches from rising to falling.

The comparator (COMP) 34d compares the voltage of the signal SG4 outputted from the differentiating circuit 34c with a threshold value and outputs the comparison result as a binary signal. The binary signal is the phase-difference detection signal SG5 accurately representing a timing of each positive-polarity pulse Pp.

<Basic Operation of Microcomputer 35>

The microcomputer 35 can measure a voltage of the amplitude detection signal SG9 outputted from the amplitude detection circuit 33, thus grasp, for example, one or both of the amplitudes A1B and A2B illustrated in FIG. 6, and calculate the magnitude and direction of the external magnetic field based on the grasped result. Further, the microcomputer 35 can measure, for example, a length of each time period T illustrated in FIG. 6 based on a timing of the phase-difference detection signal SG5 outputted from the phase detection circuit 34, and calculate the magnitude and direction of the external magnetic field based on the measured result.

Furthermore, the microcomputer 35 can sample a voltage of the signal SG2B outputted from the signal processing unit 23B and convert the sampled voltage into a digital signal to grasp the voltage value. This voltage corresponds to a change of the impedance as illustrated in FIG. 3, and thus the magnitude of the external magnetic field can be calculated from the voltage value.

<Relation Between External Magnetic Field and Operation of Phase Detection Circuit 34>

Figure 8:
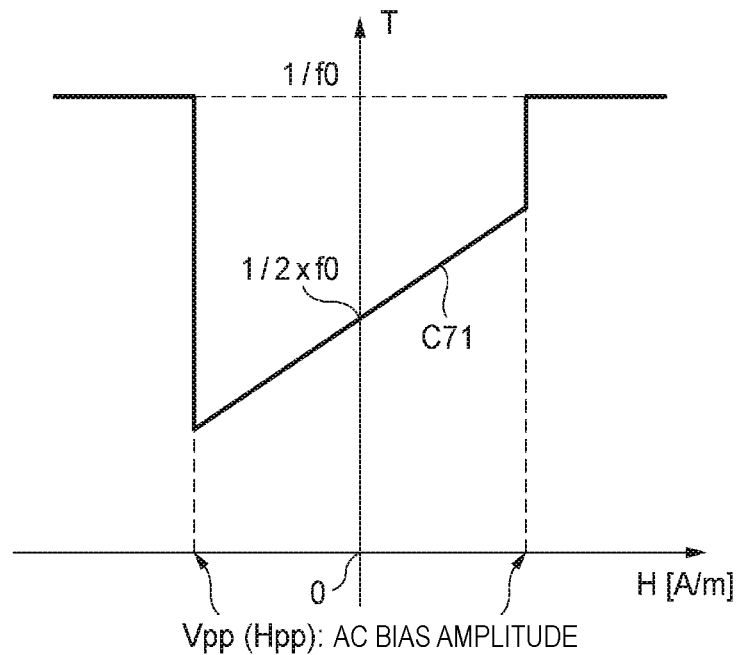
FIG. 8 is a graph illustrating an example of a relation between the external magnetic field and an operation of a phase detection circuit.

FIG. 8 illustrates a relation between the external magnetic field and an operation of the phase detection circuit 34. Characteristics C71 illustrated in FIG. 8 represent an example of detection characteristics of the phase detection circuit 34 within the detection unit 30. In FIG. 8, an abscissa represents a magnitude and a direction [A/m] of the external magnetic field H and an ordinate represents a length of the time period T (see FIGS. 6 and 7) of the positive-polarity pulse Pp in the signal SG4 or SG5 of the phase detection circuit 34.

In the characteristics C71, the time period T detected in a state where the external magnetic field H is zero is ($1/(2\cdot f0)$), as illustrated in FIG. 8. The frequency f0 is a basic frequency of the signal SG01. The detected time period T increases linearly in proportional to the change of the magnitude of the external magnetic field H within a range of the external magnetic field H of $-Vp<H<+Vp$. Vp represents the amplitude of the AC bias magnetic field. The detected time period T is constant, that is, $T=(1/f0)$ in a range of the external magnetic field H not larger than $-Vp$ or not smaller than $+Vp$.

In other words, the microcomputer 35 can calculate the magnitude and direction of the external magnetic field H based on a calculation formula corresponding to the characteristics C71 and the time period T of the phase-difference detection signal SG5 outputted from the phase detection circuit 34, so long as the external magnetic field H is within the range of $-Vp<H<+Vp$.

From the characteristics C71 illustrated in FIG. 8, the direction of the external magnetic field H can be determined as the positive direction when the detected time period T is larger than ($1/(2\cdot f0)$) and as the negative direction when the detected time period T is smaller than ($1/(2\cdot f0)$).

However, in the range of the external magnetic field H not larger than $-Vp$ or not smaller than $+Vp$, the external magnetic field H cannot be calculated from the detected time period T. The microcomputer 35 therefore calculates the magnitude and direction of the external magnetic field H utilizing the amplitude detection signal SG9 outputted from the amplitude detection circuit 33, in the range of the external magnetic field H not larger than $-Vp$ or not smaller than $+Vp$.

<Relation Between External Magnetic Field and Amplitude Detected by Amplitude Detection Circuit 33>

Figure 9:
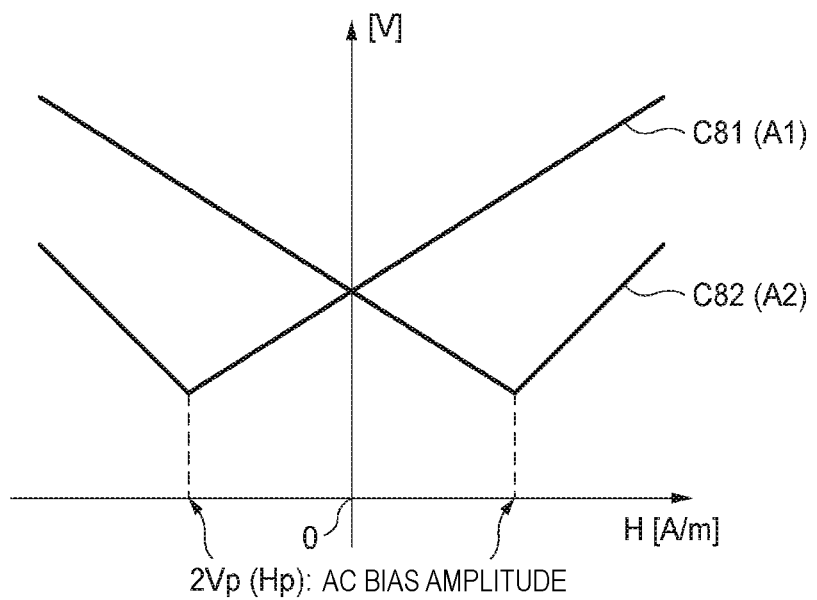
FIG. 9 is a graph illustrating an example of a relation between the external magnetic field and an amplitude detected by an amplitude detection circuit.

FIG. 9 illustrates a relation between the external magnetic field and an amplitude detected by the amplitude detection circuit 33. Characteristics C81 and C82 illustrated in FIG. 9 represent detection characteristics of the amplitude detection circuit 33. The characteristics C81 and C82 correspond to the amplitudes A1 and A2 illustrated in FIG. 6 in the amplitude detection signal SG9 outputted from the amplitude detection circuit 33, respectively.

The amplitude A1 represents a voltage [V] of the amplitude of the signal SG2 at a timing where the signal SG01 rises. The amplitude A2 represents a voltage [V] of the amplitude of the signal SG2 at a timing where the signal SG01 falls. In FIG. 9, an abscissa represents a magnitude and a direction [A/m] of the external magnetic field H and an ordinate represents voltages of the amplitudes A1 and A2.

As illustrated in FIG. 9, in the characteristics C81, the voltage of the amplitude A1 becomes the minimum when the magnitude of the external magnetic field H is 2Vp on the negative polarity side, and the voltage of the amplitude A1 increases as the magnitude of the external magnetic field H separates from this reference point.

In the characteristics C82, the voltage of the amplitude A2 becomes the minimum when the magnitude of the external magnetic field H is 2Vp on the positive polarity side, and the voltage of the amplitude A2 increases as the magnitude of the external magnetic field H separates from this reference point.

The magnitude of the external magnetic field H can therefore be calculated, for example, based on information of at least one of the characteristics C81 and C82 illustrated in FIG. 9 and the voltage of the amplitude A1 or A2 of the amplitude detection signal SG9 outputted from the amplitude detection circuit 33. Since the characteristics C81 and C82 differ to each other, the direction (positive or negative polarity) of the external magnetic field H can be specified, for example, by comparing the magnitude of the voltage between the amplitudes A1 and A2.

<Relation Between External Magnetic Field and Signal SG2B>

Figure 10:
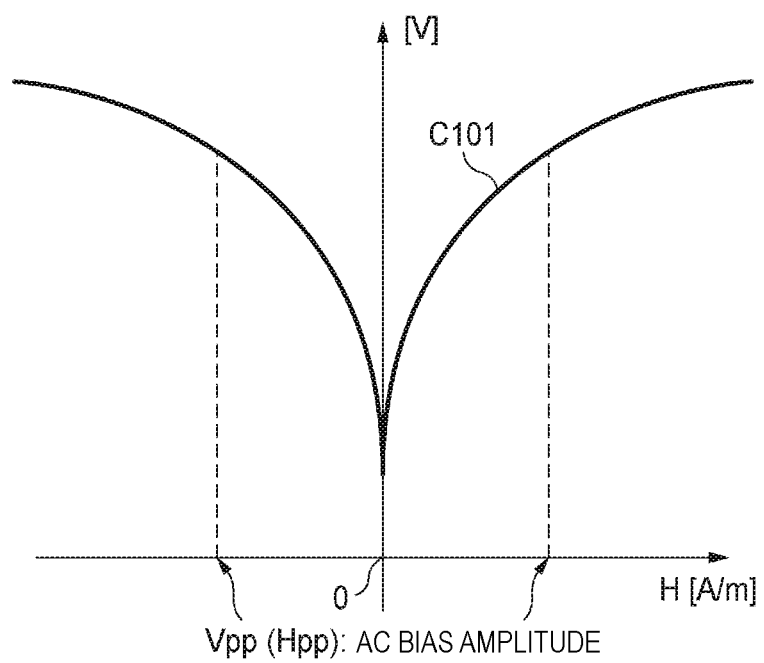
FIG. 10 is a graph illustrating an example of a relation between the external magnetic field and a signal SG2B.

FIG. 10 illustrates a relation between the external magnetic field and the signal SG2B. In detection characteristics C101 illustrated in FIG. 10, an abscissa represents a magnitude and a direction [A/m] of the magnetic field H and an ordinate represents a voltage [V] of the signal SG2B.

An impedance (DC resistance) of the magnetic thin-film 12b of the magneto-impedance element 12B changes according to the magnetic field as illustrated in FIG. 3. A voltage between the output terminals 22c and 22d of the bridge circuit 22B therefore becomes the minimum when the magnetic field H is zero, and increases rapidly according to the magnitude of the magnetic field when the magnetic field H is applied. The voltage does not reflect the change in direction of the magnetic field H. Incidentally, the voltage of the signal SG1 outputted from the oscillation circuit 21 changes with a short period, and thus the actual output voltage of the bridge circuit 22B also changes with a short period. However, since the peak-hold circuits 27 and 28 within the signal processing unit 23B each hold a peak voltage, the voltage of the signal SG1 only at the time of a high voltage appears in the signal SG2B.

<Relation Between Difference in Detecting Method and Favorable/Unfavorable Area>

Figure 11:
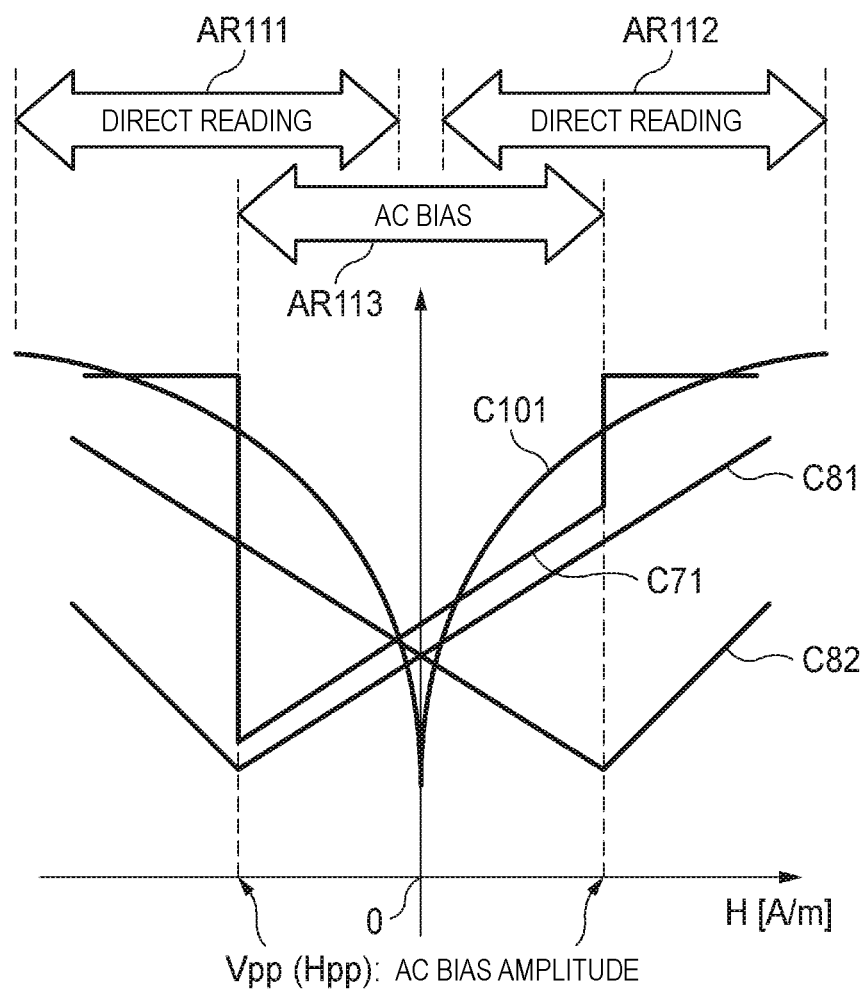
FIG. 11 is a graph illustrating an example of a relation between plural kinds of detection characteristics and areas each representing a favorable/unfavorable area.

FIG. 11 illustrates a relation between the detection characteristics C71, C81, C82 and C101 illustrated in FIGS. 8 to 10 and areas AR111, AR112 and AR113 each representing a favorable/unfavorable area for the detection characteristics. In FIG. 11, an abscissa represents the magnetic field H [A/m] and an ordinate represents a voltages [V] of the signal.

As for each of the detection characteristics C71, C81 and C82 corresponding to the output of the magneto-impedance element 12A to which the AC bias magnetic field is applied by the bias coil 14, the change of the external magnetic field H can be detected with high sensitivity in a relatively small state of the external magnetic field H. As for the detection characteristics C71 based on the phase difference detection, the change of the external magnetic field H cannot be detected when the external magnetic field H becomes larger than the amplitude Vp of the AC bias.

In contrast, in a case of utilizing the detection characteristics C101 corresponding to the case of directly reading the output of the magneto-impedance element 12B to which the AC bias magnetic field is not applied, it is difficult to precisely detect the magnitude of the external magnetic field H in a region of the small external magnetic-field H because an inclination of the voltage change is too large. In a region of the large external magnetic field H, however, the magnitude of the external magnetic field H can be detected with high sensitivity utilizing the detection characteristics C101.

Consequently, the area AR113 in a small state of the external magnetic field H is a favorable area for each of the detection characteristics C71, C81 and C82 but also contains an unfavorable area for the detection characteristics C101. The areas AR111 and AR112 each in a large state of the external magnetic field H are a favorable area for the detection characteristics C101 but contain an unfavorable area for the detection characteristics C71, C81 and C82.

<Concrete Example of Using Magnetic Field Detection Sensor 200>

The magnetic field detection sensor 200 illustrated in FIG. 1 can be utilized as a general magneto-detection device such as a direction sensor, a torque sensor, a rotation angle sensor, or a current sensor.

For example, in a case of using the magnetic field detection sensor 200 as a current sensor for detecting a DC current flowing through an electric wire to be measured of a wire harness, the current sensor is considered to be configured as described below, as a general configuration.

Although not illustrated, a magnetic core is disposed so as to surround the circumference of the electric wire to be measured and the magnetic field detection sensor 200 is disposed in a gap of the magnetic core. In this case, the magnetic field detection sensor 200 can detect a magnitude and a direction [A/m] of magnetic field H generated in proportional to a magnitude [A] of the DC current I flowing through the electric wire to be measured. That is, the magnitude and direction of the DC current I flowing through the electric wire to be measured can be detected by the magnetic field detection sensor 200.

Supposing, for example, that the electric wire to be measured is a main line of a wire harness mounted on an automobile, the maximum current value is about several hundreds of amperes. The current sensor used for such an application is required to be able to precisely measure the current in a wide range from small to large currents.

For example, in a case of constituting the current sensor as described above, the magnetic field detection sensor 200 illustrated in FIG. 1 is employed, and at least two of the detection characteristics C71, C81, C82 and C101 illustrated in FIG. 11 are combined to optimize the detection result.

In this case, as a concrete example, the following two kinds of detection methods are combined and used. (1) Using the detection method corresponding to the detection characteristics C101 illustrated in FIG. 10, a current Id [A] corresponding to a detected magnetic field H is obtained. (2) Using the detection method of utilizing a difference between the detection characteristics C81 and C82 illustrated in FIG. 9, that is, an amplitude (A1-A2), a current Iac [A] corresponding to a detected magnetic field H is obtained.

In order to obtain an optimum measurement result combining the methods (1) and (2), for example, the currents Id and Iac are respectively weighted using two coefficients w1 and w2 shown in the following Table 1, and a current value I [A] is calculated according the following formula.

$$I = w1 \cdot Id + w2 \cdot Iac. \quad (1)$$

TABLE 1

| Weighted | Measured magnetic field | |
| --- | --- | --- |
| coefficient | Low | High |
| w1 | Small | Large |
| w2 | Large | Small |

In the example of Table 1, a small weight and a large weight are allocated to the two coefficients w1 and w2 in a small region of the external magnetic field to be measured, respectively. In contrast, a large weight and a small weight are allocated to the two coefficients w1 and w2 in a large region of the external magnetic field to be measured, respectively.

When performing calculation of the formula (1), for example, in the area AR113 illustrated in FIG. 11, the weight of the current Id reflecting the detection characteristics C101 can be made small and the weight of the current Iac reflecting the difference (A1-A2) of the detection characteristics C81 and C82 can be made large. Further, for example, in the areas AR111 and AR 112 illustrated in FIG. 11, the weight of the current Id reflecting the detection characteristics C101 can be made large and the weight of the current Iac reflecting the difference (A1-A2) of the detection characteristics C81 and C82 can be made small. In this manner, since the large weights are allocated to the respective regions favorable for the detection methods, a detection error of the current value I can be reduced in a wide range.

<Correction Processing of Detection Characteristics>

In a state of properly utilizing the plural kinds of detection characteristics using the weighting etc., a discontinuous point or a non-linear portion likely occurs, for example, at a position where the plural kinds of detection characteristics are switched, and thus an error contained in the measurement result increases. In order to reduce an error generated, for example, due to influence of the switching of the plural kinds of detection characteristics, it is required to revise shapes etc., of the plural kinds of detection characteristics to a similar state to each other in advance. A concrete example of such a revise will be described.

<Characteristics of Initial State>

Figure 12:
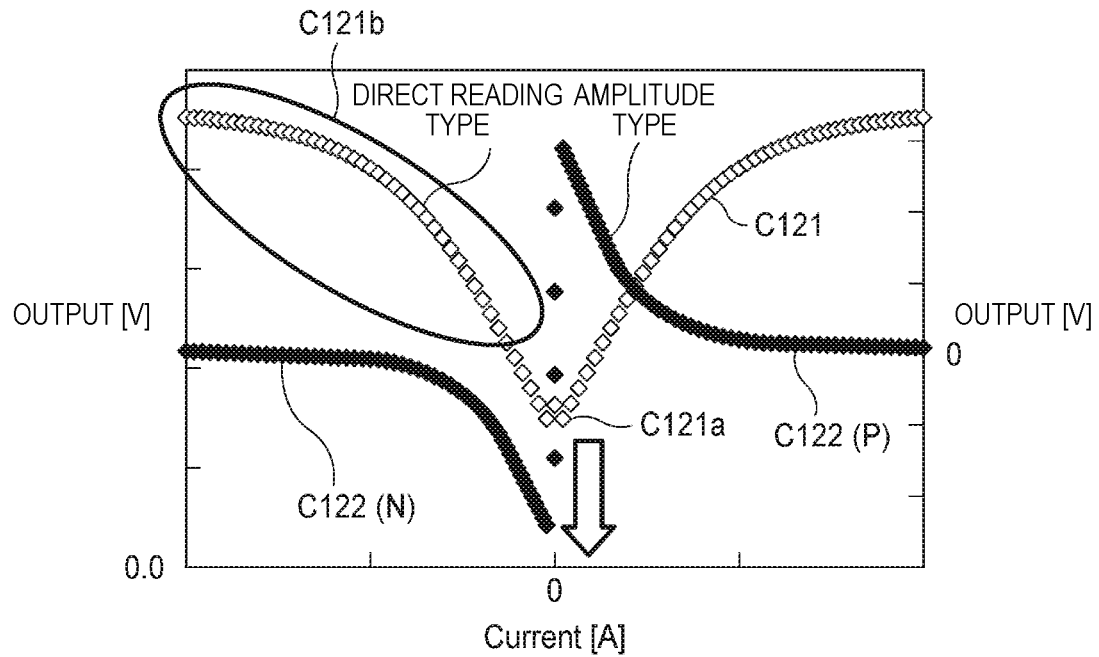
FIG. 12 is a graph illustrating, side-by-side, initial states of two kinds of detection characteristics.

FIG. 12 illustrates initial states of two kinds of detection characteristics C121 and C122 disposed side by side. The detection characteristics C121 illustrated in FIG. 12 is calculated from the signal SG2B reflecting the characteristics of the magneto-impedance element 12B. The detection characteristics C122 illustrated in FIG. 12 is calculated from the amplitude (A1-A2) detected by the amplitude detection circuit 33 based on the signal SG2 reflecting the characteristics of the magneto-impedance element 12A.

In FIG. 12, an abscissa represents a current value I [A], a left-side ordinate represents an output voltage [V] of the detection characteristics C121, and a right-side ordinate represents an output voltage [V] of the detection characteristics C122.

As illustrated in FIG. 12, two detection characteristics C121 and C122 largely differ in a shape etc. In the detection characteristics C121, the voltage at a point C121a, at which the current is zero, becomes the minimum but not zero. In the detection characteristics C122, there are singular points in the proximity of zero of the current. That is, the singular point at the left end of characteristics C122(P) representing a positive-side current region is largely off the singular point at the right end of characteristics C122(N) representing a negative-side current region, and thus the detection characteristics C122 is discontinuous.

<Correction of Each Characteristics>

Thus, the following correction processing is performed on two detection characteristics C121 and C122 illustrated in FIG. 12.

(1) In the detection characteristics C121, a negative-side region C121b of the current is multiplied by a coefficient "−1". (2) In the detection characteristics C121, an offset voltage for shifting the voltage of the minimum point C121a to 0 [V] is added to (or subtracted from) the entirety of the detection characteristics C121. (3) In the detection characteristics C122, an offset voltage for shifting the voltage of the singular point at the left end of characteristics C122(P) of the positive-side current region to 0 [V] is added to (or subtracted from) the entirety of the characteristics C122(P). (4) In the detection characteristics C122, an offset voltage for shifting the voltage of the singular point at the right end of characteristics C122(N) of the negative-side current region to 0 [V] is added to (or subtracted from) the entirety of the characteristics C122(N).

Figure 13:
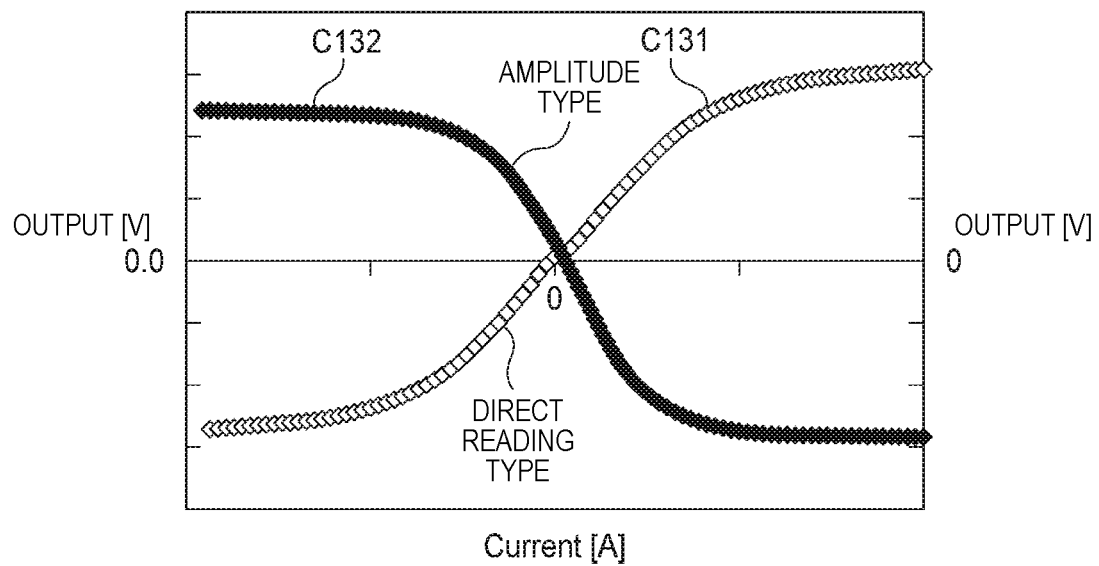
FIG. 13 is a graph illustrating a result of correcting offsets of the respective characteristics illustrated in FIG. 12 and correcting the polarity of a partial region thereof.

Detection characteristics C131 and C132 illustrated in FIG. 13 are obtained as a result of the correction processing (1) to (4). The detection characteristics C131 and C132 correspond to the detection characteristics C121 and C122 illustrated in FIG. 12, respectively. In FIG. 13, an abscissa represents a current value I [A], a left-side ordinate represents an output voltage [V] of the detection characteristics C131, and a right-side ordinate represents an output voltage [V] of the detection characteristics C132.

Figure 14:
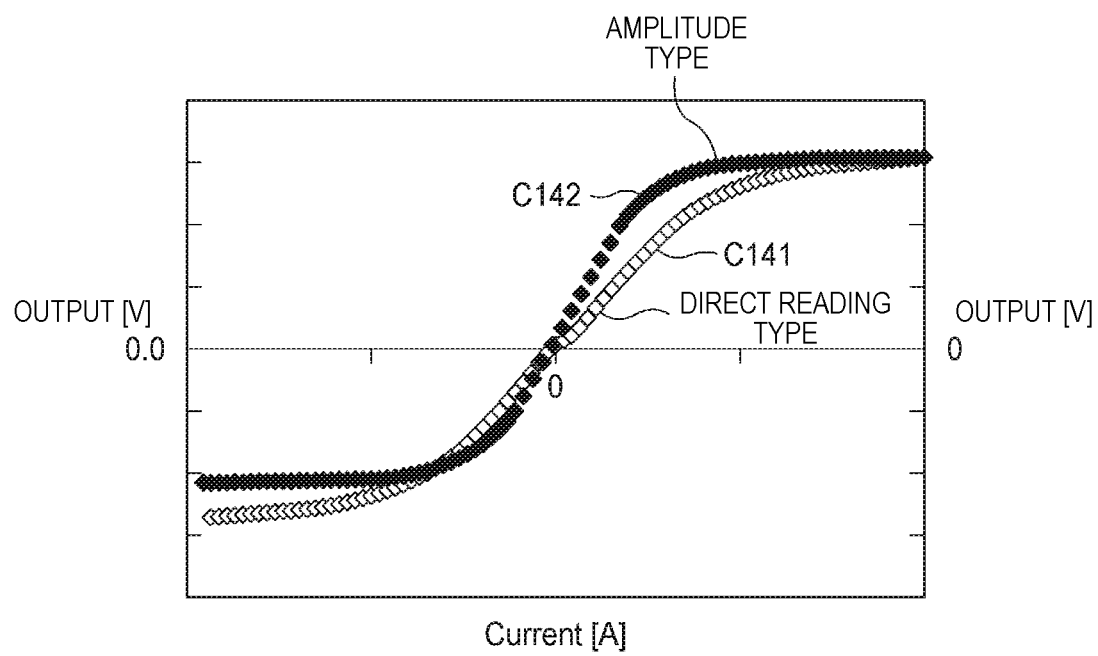
FIG. 14 is a graph illustrating, side-by-side, the two characteristics illustrated in FIG. 13, representing a result of inverting the polarity of one characteristics.

Succeedingly, one detection characteristics C132 illustrated in FIG. 13 is entirely multiplied by a coefficient "−1" such that the detection characteristics is corrected so as to invert the voltage polarity. Detection characteristics C141 and C142 illustrated in FIG. 14 are obtained as a result of this correction processing. The detection characteristics C141 and C142 correspond to the detection characteristics C131 and C132 illustrated in FIG. 13, respectively. In FIG. 14, an abscissa represents a current value I [A], a left-side ordinate represents an output voltage [V] of the detection characteristics C141, and a right-side ordinate represents an output voltage [V] of the detection characteristics C142.

It will be understood that two detection characteristics C141 and C142 illustrated in FIG. 14 have similar shapes and characteristics to each other. Accordingly, it is relatively easy to properly utilize the detection characteristics C141 and C142.

<Weighting of Characteristics>

Figure 15:
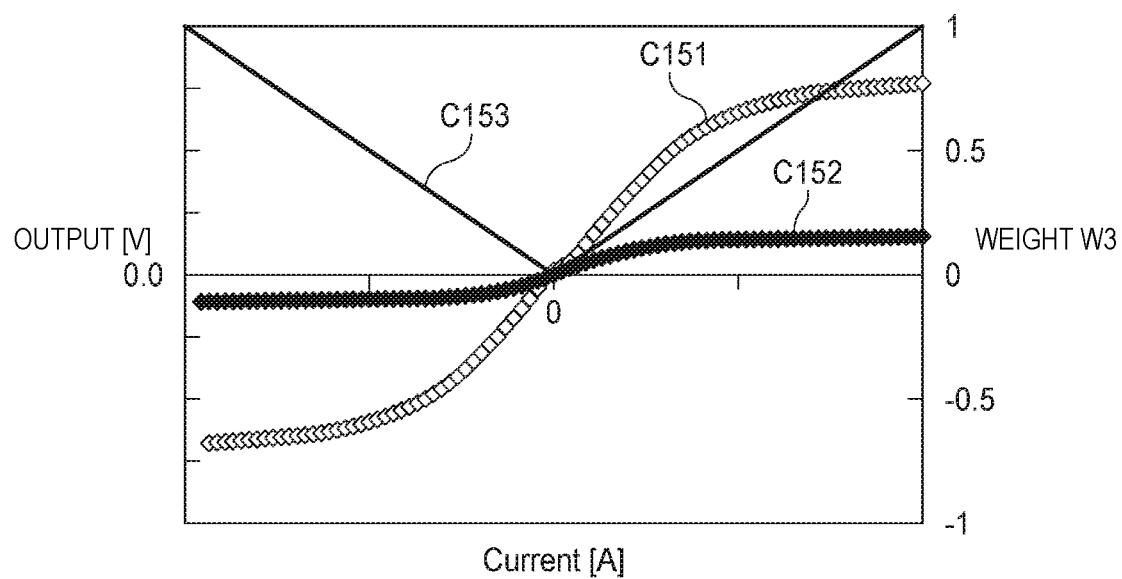
FIG. 15 is a graph illustrating an example of a relation between plural characteristics and a weight.

In the case of performing the weighting as described above, for example, a weight w3 that changes lineally and continuously according to a magnitude of the current may be employed, like characteristics C153 illustrated in FIG. 15. Of course, a weight that changes curvedly may be employed.

In FIG. 15, an abscissa represents a current value I [A], a left-side ordinate represents output voltages [V] of detection characteristics C151 and C152, and a right-side ordinate represents the weight w3. The weight w3 is a value in a range of "0" to "1" in this case. The detection characteristics C151 and C152 correspond to the detection characteristics C141 and C142 illustrated in FIG. 14, respectively.

In a case of using the weight w3 illustrated in FIG. 15, a current value I [A] is calculated according the following current conversion formula.

$$I = w3 \cdot Id + (1-w3) \cdot Iac \cdot K \quad (2)$$

Id represents a detection current value corresponding to an output voltage of the detection characteristics C151, Iac represents a detection current value corresponding to an output voltage of the detection characteristics C152, and K represents a coefficient for compensating a difference between the values Id and Iac.

Figure 16:
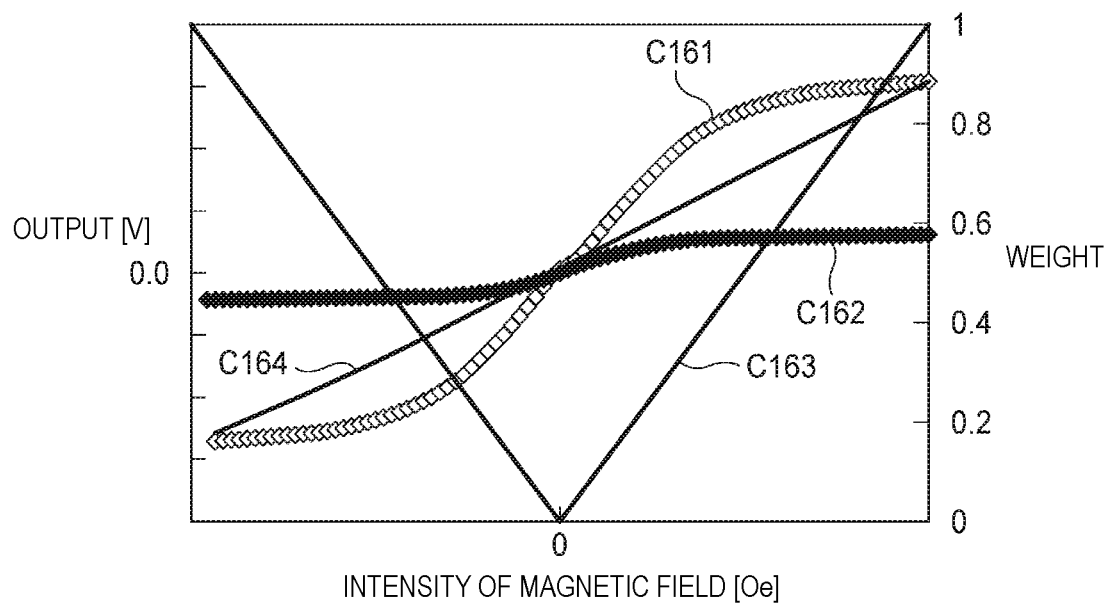
FIG. 16 is a graph illustrating characteristics before and after current conversion processing using the weight.

When executing a calculation of the formula (2), detection characteristics having linear characteristics with respect to the change of current I to be measured can be obtained, like detection characteristics C164 illustrated in FIG. 16. Detection characteristics C161, C162 and C163 illustrated in FIG. 16 correspond to the detection characteristics C151, C152 and C153 illustrated in FIG. 15, respectively. In FIG. 16, an abscissa represents a current value I [A], a left-side ordinate represents output voltages [V] of the detection characteristics C161 and C162, and a right-side ordinate represents the weight w3.

In the detection characteristics C122 illustrated in FIG. 12, there are the singular points in the proximity of zero of the current. The singular point at the left end of characteristics C122(P) representing the positive-side current region is largely off the singular point at the right end of characteristics C122(N) representing the negative-side current region, and thus the detection characteristics C122 is discontinuous. In this case, even if the offset adjustment is performed on each of the characteristics C122(P) and C122(N) as described above, these characteristics are actually not corrected to have the fine shape like the characteristics C132 illustrated in FIG. 13.

Figure 17:
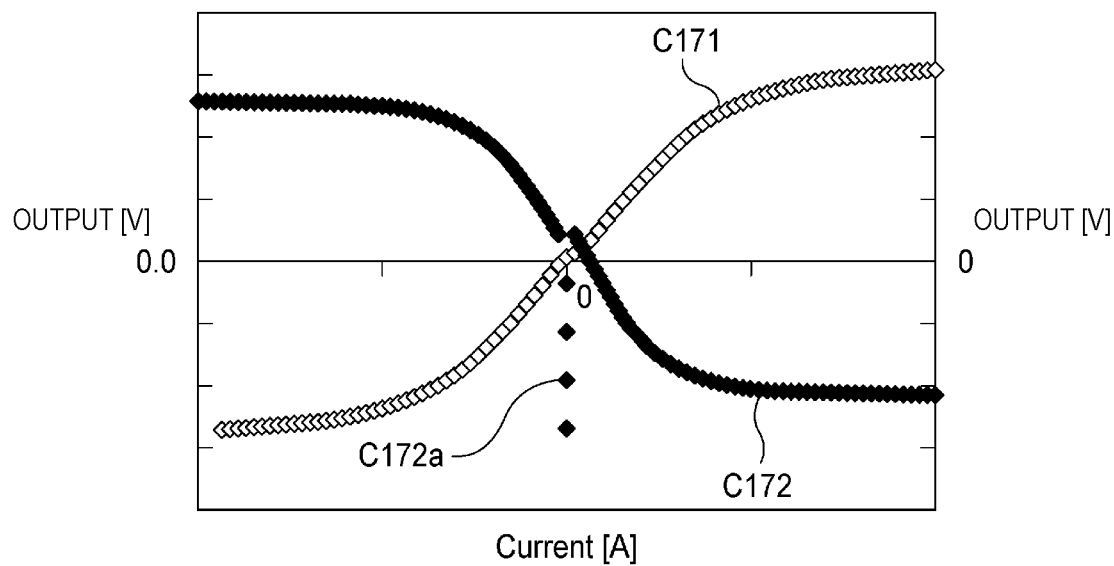
FIG. 17 is a graph illustrating, side-by-side, two characteristics in a case where a non-linear region appears near a singular point.

When the offset adjustment is performed on each of the characteristics C122(P) and C122(N) illustrated in FIG. 12, these characteristics are corrected to have a shape like characteristics C172 illustrated in FIG. 17. Detection characteristics C171 and the detection characteristics C172 illustrated in FIG. 17 correspond to the detection characteristics C131 and C132 illustrated in FIG. 13, respectively. In the detection characteristics C172, a non-linear region C172a appears in the proximity of zero of the current.

Figure 18:
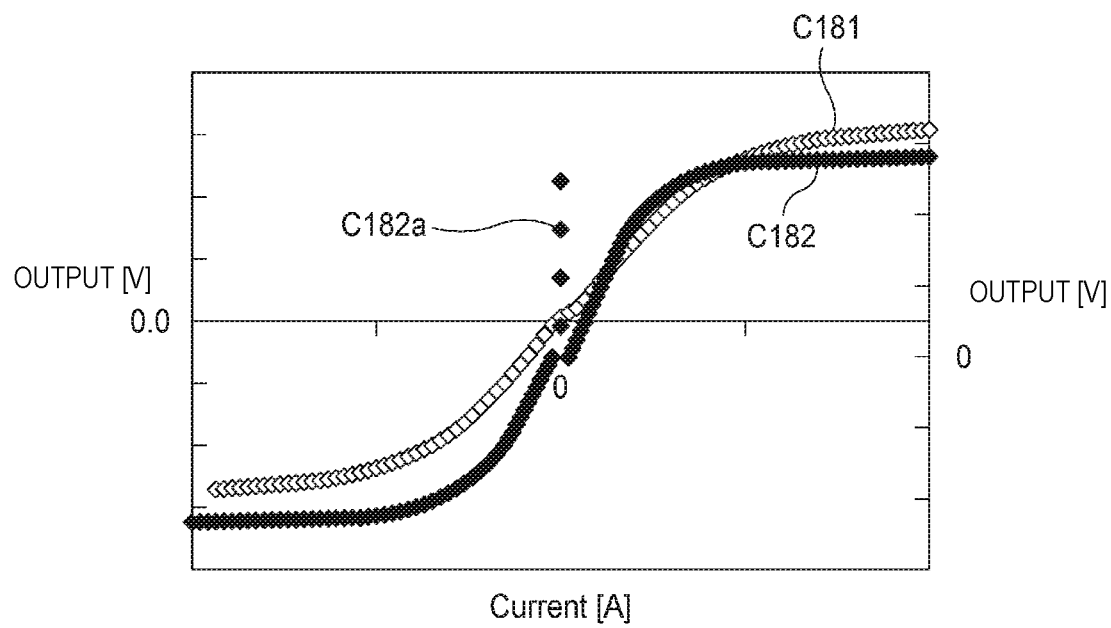
FIG. 18 is a graph illustrating, side-by-side, the two characteristics illustrated in FIG. 17, representing a result of inverting the polarity of one characteristics.

When the detection characteristics C172 illustrated in FIG. 17 is entirely multiplied by a coefficient "−1", characteristics C182 illustrated in FIG. 18 is obtained as a result of the multiplication. Detection characteristics C181 and the detection characteristics C182 illustrated in FIG. 18 correspond to the detection characteristics C171 and C172 illustrated in FIG. 17, respectively. In the detection characteristics C182, a non-linear region C182a appears in the proximity of zero of the current.

Figure 19:
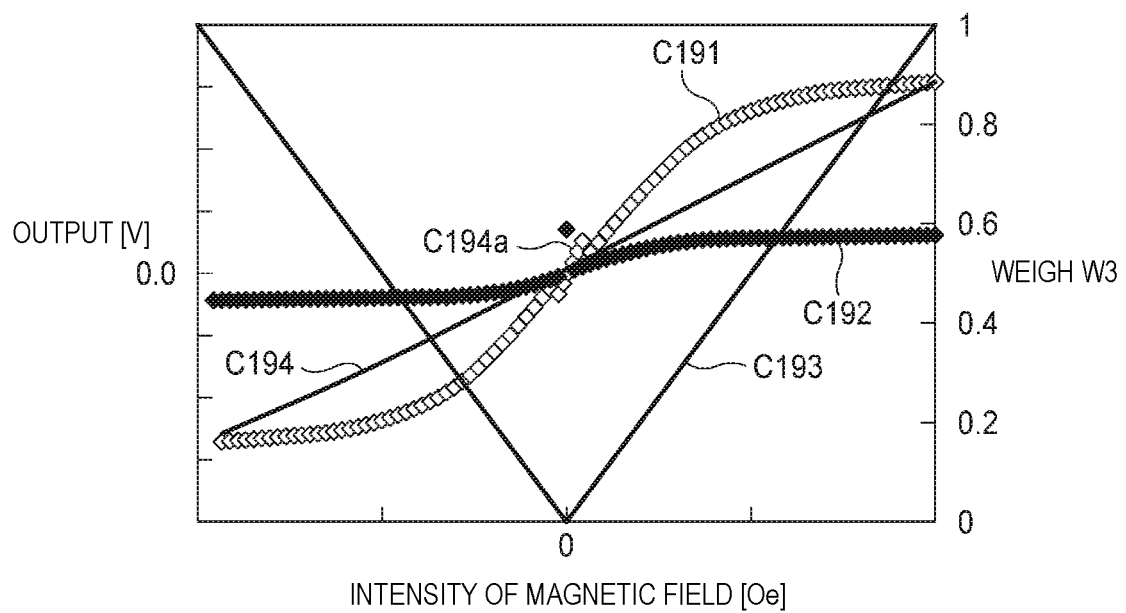
FIG. 19 is a graph illustrating an example of a relation between the two characteristics illustrated in FIG. 18 and the weight.

When the characteristics C181 and C182 illustrated in FIG. 18 are weighted by the weight w3 of characteristics C193 illustrated in FIG. 19 and subjected to the current conversion of the formula (2), characteristics C194 illustrated in FIG. 19 is obtained. Detection characteristics C191 and C192 illustrated in FIG. 19 correspond to the detection characteristics C181 and C182 illustrated in FIG. 18, respectively.

The characteristics C194 illustrated in FIG. 19 is linear as a whole, but anon-linear region C194a appears in the proximity of zero of the current. Thus, gain adjustment is performed on the non-linear region C194a of the characteristics C194. The region C194a of the characteristics C194 is corrected to be linear as a result of the adjustment, and thus the detection characteristics C164 having linear characteristics as a whole can be obtained as illustrated in FIG. 16.

The magnetic field detection sensor 200 illustrated in FIG. 1 includes both the magneto-impedance element 12A applied with the AC bias magnetic field and the magneto-impedance element 12B not applied with the AC bias magnetic field, and hence a measurement result with high accuracy can be attained over a wide magnetic-field range. In other words, in a case of detecting the external magnetic field based on the signal SG2 influenced by the magneto-impedance element 12A, the detection with high sensitivity can be achieved in a region of a relatively small magnetic field. Thus, entire detection accuracy can be enhanced by increasing the weight in the region of a small magnetic field. Also, in a case of detecting the external magnetic field based on the signal SG2B influenced by the magneto-impedance element 12B, the detection with high sensitivity can be achieved in a region of a relatively large magnetic field. Thus, entire detection accuracy can be enhanced by increasing the weight in the region of a large magnetic field.

By employing the magneto-impedance elements 12A and 12B with the pyramid-shaped impedance characteristics as illustrated in FIG. 3, it is not required to flow a large DC bias current in order to shift the operation point, and hence the current consumption can be reduced.

Herein the features of the embodiment of the magnetic field detection sensor according to the invention will be briefly summarized and listed below in [1] to [5].

[1] A magnetic field detection sensor comprising:
a first magneto-impedance element (magneto-impedance element 12A) and a second magneto-impedance element (magneto-impedance element 12B) each having a magnetic material;
a bias coil (14) applying a bias magnetic field to a magnetic body of the first magneto-impedance element;
a high-frequency oscillation circuit (oscillation circuit 21) supplying high-frequency current to the magnetic body of the first magneto-impedance element and a magnetic body of the second magneto-impedance element;
an AC bias circuit (amplifier 37) supplying AC bias current to the bias coil;
a first detection circuit (signal processing unit 23A) generating a first detection signal based on an impedance change of the first magneto-impedance element in a state of being applied with the bias magnetic field and an external magnetic field;
a second detection circuit (signal processing unit 23B) generating a second detection signal based on an impedance change of the second magneto-impedance element in a state of being applied with the external magnetic field and without the bias magnetic field; and
a magnetic field calculation unit (microcomputer 35) calculating a magnitude and a direction of the external magnetic field based on the first detection signal and the second detection signal.

[2] The magnetic field detection sensor described in [1], wherein the first detection circuit generates an electric signal (SG2) which changes according to a change amount of the impedance from a reference point that is an external value position of the impedance characteristic of the first magneto-impedance element in a state of being not applied with the external magnetic field, and
wherein the first detection circuit includes at least one of an amplitude detection circuit (33) detecting amplitudes at each of peaks in which positive and negative of a changing ratio of voltage of the electric signal switches, and a phase detection circuit (34) detecting a timing at which the voltage of the electric signal passes the reference point.

[3] The magnetic field detection sensor described in [1], wherein the magnetic field calculation unit performs weighting (see Table 1 and FIG. 15), using a weight which changes according to a situation, on at least one of the first detection signal and the second detection signal so as to calculate the magnitude of the external magnetic field.

[4] The magnetic field detection sensor described in [1], wherein the magnetic field calculation unit calculates the magnitude and the direction of the external magnetic field using a combination of the first detection signal and the second detection signal, which have different detection characteristics, and
wherein the magnetic field calculation unit performs polarity correction for each region and offset correction on the detection characteristic of at least one of the first detection signal and the second detection signal so that the plurality of detection characteristics become close to each other (see FIGS. 12 to 14).

[5] The magnetic field detection sensor described in [4], wherein the magnetic field calculation unit performs gain adjustment on the detection characteristic of at least one of the first detection signal and the second detection signal so as to bring a non-linear region (C194a) corresponding to a small magnetic field close to a linear region.

DESCRIPTION OF THE REFERENCE NUMERALS AND SIGNS 12, 12A, 12B magneto-impedance element
12a non-magnetic substrate
12b magnetic thin-film
12c, 12d electrode
14 bias coil
20 drive unit
21 oscillation circuit
22A, 22B bridge circuit
23A, 23B signal processing unit
24, 25, 26 resistor
27, 28 peak-hold circuit
29 instrumentation amplifier
30 detection unit
31, 34b amplifier
32 switch circuit
33 amplitude detection circuit
33a low-pass fitter
33c analog switch
33d peak-hold circuit
34 phase detection circuit
34a, 34c differentiating circuit
34d comparator
35 microcomputer
36 switch circuit
37 amplifier
41 impedance characteristics
41r reference point
42 AC bias magnetic field
42P, 42N sum of external magnetic field and AC bias magnetic field
43, 43P, 43N sensor output signal
100 printed board
100a, 100b electrode
100c notch
200 magnetic field detection sensor

What is claimed is:
1. A magnetic field detection sensor comprising:
a first magneto-impedance element and a second magneto-impedance element each having a magnetic material;
a bias coil applying a bias magnetic field to a magnetic body of the first magneto-impedance element;
a high-frequency oscillation circuit supplying high-frequency current to the magnetic body of the first magneto-impedance element and a magnetic body of the second magneto-impedance element;
an AC bias circuit supplying AC bias current to the bias coil;
a first detection circuit generating a first detection signal based on an impedance change of the first magneto-impedance element in a state of being applied with the bias magnetic field and an external magnetic field;
a second detection circuit generating a second detection signal based on an impedance change of the second magneto-impedance element in a state of being applied with the external magnetic field and without the bias magnetic field; and
a magnetic field calculation unit calculating a magnitude and a direction of the external magnetic field based on the first detection signal and the second detection signal.

2. The magnetic field detection sensor according to claim 1,
wherein the first detection circuit generates an electric signal which changes according to a change amount of the impedance from a reference point that is an extremal value position of the impedance characteristic of the first magneto-impedance element in a state of being not applied with the external magnetic field, and
wherein the first detection circuit includes at least one of an amplitude detection circuit detecting amplitudes at each of peaks in which positive and negative of a changing ratio of voltage of the electric signal switches, and a phase detection circuit detecting a timing at which the voltage of the electric signal passes the reference point.

3. The magnetic field detection sensor according to claim 1,
wherein the magnetic field calculation unit performs weighting, using a weight which changes according to a situation, on at least one of the first detection signal and the second detection signal so as to calculate the magnitude of the external magnetic field.

4. The magnetic field detection sensor according to claim 1,
wherein the magnetic field calculation unit calculates the magnitude and the direction of the external magnetic field using a combination of the first detection signal and the second detection signal, which have different detection characteristics, and
wherein the magnetic field calculation unit performs polarity correction for each region and offset correction on the detection characteristic of at least one of the first detection signal and the second detection signal so that the plurality of detection characteristics become close to each other.

5. The magnetic field detection sensor according to claim 4,
wherein the magnetic field calculation unit performs gain adjustment on the detection characteristic of at least one of the first detection signal and the second detection signal so as to bring a non-linear region corresponding to a small magnetic field close to a linear region.

6. A magnetic field detection sensor comprising:
a first magneto-impedance element and a second magneto-impedance element each having a magnetic material;
a bias coil applying a bias magnetic field to a magnetic body of the first magneto-impedance element;
a high-frequency oscillation circuit supplying high-frequency current to the magnetic body of the first magneto-impedance element and a magnetic body of the second magneto-impedance element;
an AC bias circuit supplying AC bias current to the bias coil;
a first detection circuit generating a first detection signal based on an impedance change of the first magneto-impedance element in a state of being applied with the bias magnetic field and an external magnetic field;
a second detection circuit generating a second detection signal based on an impedance change of the second magneto-impedance element in a state of being applied with the external magnetic field and without the bias magnetic field; and
a microcomputer having a program stored therein, wherein execution of the program controls the microcomputer to:
calculate a magnitude and a direction of the external magnetic field based on the first detection signal and the second detection signal.

7. The magnetic field detection sensor according to claim 6,
wherein the first detection circuit generates an electric signal which changes according to a change amount of the impedance from a reference point that is an extremal value position of the impedance characteristic of the first magneto-impedance element in a state of being not applied with the external magnetic field, and
wherein the first detection circuit includes at least one of an amplitude detection circuit detecting amplitudes at each of peaks in which positive and negative of a changing ratio of voltage of the electric signal switches, and a phase detection circuit detecting a timing at which the voltage of the electric signal passes the reference point.

8. The magnetic field detection sensor according to claim 6,
wherein the microcomputer, upon execution of the program, is configured to:
perform weighting, using a weight which changes according to a situation, on at least one of the first detection signal and the second detection signal so as to calculate the magnitude of the external magnetic field.

9. The magnetic field detection sensor according to claim 6,
wherein the microcomputer, upon execution of the program, is configured to:
calculate the magnitude and the direction of the external magnetic field using a combination of the first detection signal and the second detection signal, which have different detection characteristics, and
perform polarity correction for each region and offset correction on the detection characteristic of at least one of the first detection signal and the second detection signal so that the plurality of detection characteristics become close to each other.

10. The magnetic field detection sensor according to claim 9,
wherein the microcomputer, upon execution of the program, is configured to:
perform gain adjustment on the detection characteristic of at least one of the first detection signal and the second detection signal so as to bring a non-linear region corresponding to a small magnetic field close to a linear region.

* * * * *